United States Patent
Yahagi

(10) Patent No.: US 6,182,271 B1
(45) Date of Patent: Jan. 30, 2001

(54) CELL PLACEMENT METHOD AND APPARATUS FOR INTEGRATED CIRCUIT AND STORAGE MEDIUM HAVING CELL PLACEMENT PROGRAM FOR INTEGRATED CIRCUIT STORED THEREON

(75) Inventor: Noriko Yahagi, Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 08/953,749

(22) Filed: Oct. 17, 1997

(30) Foreign Application Priority Data

Mar. 19, 1997 (JP) .................................................. 9-066944

(51) Int. Cl.⁷ .................................................. G06F 17/50
(52) U.S. Cl. ................................................. 716/10; 716/12
(58) Field of Search .................. 395/500.02, 500.19, 395/500.025; 716/1–21

(56) References Cited

U.S. PATENT DOCUMENTS

| | | | |
|---|---|---|---|
| 5,264,390 | * 11/1993 | Nagase et al. | 438/599 |
| 5,303,161 | * 4/1994 | Burns et al. | 716/9 |
| 5,729,467 | * 3/1998 | Katsumata et al. | 395/500.16 |
| 5,801,960 | * 9/1998 | Takano et al. | 395/500.11 |
| 5,831,870 | * 11/1998 | Folta et al. | 716/5 |
| 5,917,729 | * 6/1999 | Naganuma et al. | 395/500.11 |
| 5,926,397 | * 7/1999 | Yamanouchi | 395/500.15 |
| 5,946,476 | * 8/1999 | Tomoda | 716/9 |
| 6,002,857 | * 12/1999 | Ramachandran | 716/14 |
| 6,006,024 | * 12/1999 | Guruswamy et al. | 716/12 |
| 6,011,912 | * 1/2000 | Yui et al. | 716/13 |

FOREIGN PATENT DOCUMENTS

| | | | |
|---|---|---|---|
| 05013577 | * 1/1993 | (JP) | H01L/21/82 |
| 5-82642 | 4/1993 | (JP) | H01L/21/82 |

OTHER PUBLICATIONS

Sato et al. ("Post–Layout Optimization for Deep Submicron Design", 1996 Proceedings of the 33rd Design Automation Conference, Jan. 1, 1996, pp. 1–6).*

* cited by examiner

Primary Examiner—Paul R. Lintz
Assistant Examiner—Phallaka Kik
(74) Attorney, Agent, or Firm—Staas & Halsey LLP

(57) ABSTRACT

The invention provides a cell placement method and apparatus wherein an area for cell's placement is assured to place cells as many as possible to be placed efficiently on a single chip and a storage medium on which a cell placement program which allows such placement is stored. In the cell placement method and apparatus, in order to design an integrated circuit having a plurality of routing layers, when to place cells in a situation wherein a wire is already routed prior to the placement of the cells is present, placement of each of the cells at a position at which the cell overlaps with the already routed wire is permitted unless a wiring pattern in the cell and the already routed wire overlap with each other in a same routing layer. The invention is applied, in designing an integrated circuit (LSI, VLSI, ASIC or the like) having a plurality of routing layers, for example, a gate array to placement of cells on a chip in a state wherein an already routed wire such as a bulk power supply wire or a clock signal wire routed prior to the placement of the cells is present.

38 Claims, 13 Drawing Sheets

FIG. 5(a) FIG. 5(b)
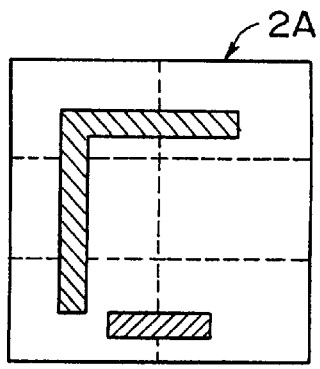
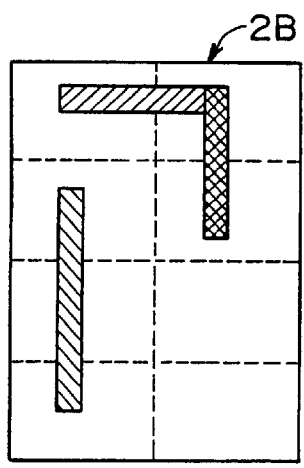
FIRST LAYER
SECOND LAYER
THIRD LAYER
FIG. 6(a) FIG. 6(b)
| 1 | 1 |
|---|---|
| 1 | 0 |
| 2 | 2 |
| 2 | 3 |
|---|---|
| 1 | 3 |
| 1 | 0 |
| 1 | 0 |

FIG. 8

| | | | | | | |
|---|---|---|---|---|---|---|
| 4 | 4 | 4 | 4 | 4 | 4 | 4 |
| 3 | 3 | 3 | 3 | 3 | 3 | 3 |
| 3 | 3 | 3 | 3 | 3 | 3 | 3 |
| 3 | 3 | 3 | 3 | 3 | 3 | 3 |
| 3 | 3 | 3 | 3 | 3 | 3 | 3 |
| 3 | 3 | 3 | 3 | 3 | 3 | 3 |
| 4 | 4 | 4 | 4 | 4 | 4 | 4 |

Vdd: ▨
Vss: ▧

CELL PLACEMENT METHOD AND APPARATUS FOR INTEGRATED CIRCUIT AND STORAGE MEDIUM HAVING CELL PLACEMENT PROGRAM FOR INTEGRATED CIRCUIT STORED THEREON

BACKGROUND OF THE INVENTION

1. Field of the Invention

This invention relates to a method of and an apparatus for placement, upon designing of an integrated circuit (LSI, VLSI, ASIC or the like) having a plurality of routing layers of, for example, the gate array, of cells on a chip in a situation wherein a wire has already routed prior to such placement of cells such as a bulk power supply or a clock signal are present as well as a storage medium on which a cell placement program is stored.

2. Description of the Related Art

As a most representative one of integrated circuits such as, for example, application specific integrated circuits (ASICs), a gate array of the full area device type having no region for exclusive use for routing is known. In order to produce a gate array, a master wafer for which a step of production of transistors has completed and in which basic cells each formed from a plurality of transistors are placed in gratings is prepared in advance, and the connection of routing of a metal is changed so as to realize a desired function.

A gate array produced in this manner usually has a plurality of routing layers (for example, three layers), and a wire such as a bulk power supply or clock a signal is sometimes routed already on some of those layers prior to placement of cells. FIG. 13 shows in plan view an example wherein bulk power supply wires (Vdd and Vss) 1 are routed already. Further, an enlarged view of a XIV portion in FIG. 13 is shown in FIG. 14. It is to be noted that the size of one grating shown in FIG. 14 corresponds to the size of a basic cell, and such grating is hereinafter referred to as site unit. Cells are placed along frames of site units without fail. If a grating frame along which cells are placed is used as a unit, the cells need not be basic cells.

If a cell 2 is placed, in a situation wherein a bulk power supply wire (already routed wire) 1 is present, at a position at which it overlaps with the bulk power supply wire 1 as viewed on the plane of the chip as seen in FIG. 14, if a wiring pattern 3 in the cell 2 and the bulk power supply wire 1 are present in the same routing layer, then they short-circuit to each other.

Therefore, in order to prevent occurrence of such short-circuiting with certainty, it is a conventional countermeasure to produce a cell placement prohibition in advance in a region decided to be passed by any bulk power supply wire 1 so that, when automatic placement of cells 2 is to be performed subsequently, the cells 2 may not be placed in the region at all.

Accordingly, with such a conventional cell placement procedure as described above, even if the routing layer of a bulk power supply wire 1 and the routing layer of the wiring pattern 3 in a cell 2 are different from each other and no short-circuiting actually occurs between them, it is quite impossible to place the cell 2 at a position at which it overlaps with the bulk power supply wire 1 as viewed on the plane of the chip.

In short, since placement of a cell 2 in a region (already routed region such as a bulk power supply wire 1) in which it is actually possible to place a cell 2 is prohibited completely, the area which can be used for placement of cells 2 is remarkably smaller than the actual size of a base bulk.

In designing of an integrated circuit such as an LSI, a VLSI or an ASIC, it is necessary to place cells and route between them within a limited area so that specifications or electric characteristics of a circuit may be satisfied. Particularly in recent years, an increase in density and function is required, and it is important that cells are placed efficiently on a single chip.

Thus, it is desired that placement of a cell 2 in a region in which a cell 2 can be placed be not prohibited and the region be utilized effectively so as to place cells as many as possible.

SUMMARY OF THE INVENTION

It is an object of the present invention to provide a cell placement method and apparatus for an integrated circuit wherein a placement region for cells is assured to place cells as many as possible to be placed efficiently on a single chip thereby to allow the design of an integrated circuit having a high density and a large number of functions.

In order to attain the object described above, according to an aspect of the present invention, there is provided a cell placement method for an integrated circuit for placing cells in a situation wherein an already routed wire routed prior to the placement of the cells is present in order to design an integrated circuit having a plurality of routing layers, comprising the step of permitting placement of each of the cells at a position at which the cell overlaps with the already routed wire unless a wiring pattern in the cell and the already routed wire overlap with each other in a same routing layer.

According to another aspect of the present invention, there is provided a cell placement apparatus for an integrated circuit for placing cells in a state in which an already routed wire routed prior to the placement of the cells in order to design an integrated circuit having a plurality of routing layers, comprising an already routed wire information storage section for storing a routing state of the already routed wire, a wiring pattern information storage section for storing wiring patterns in the cells, a search section for searching a position of any of the cells based on the routing state of the already routed wire of the already routed wire information storage section and a wiring pattern in the cell of the wiring pattern information storage section, and a placement permission/rejection discrimination section for discriminating, when search for a position of any of the cells is performed by the search section, an overlapping state between the wiring pattern in the cell and the already routed wire at the position of the cell based on the routing state of the already routed wire of the already routed wire information storage section and the wiring pattern in the cell of the wiring pattern information storage section and permitting the placement of the cell at the position when the wiring pattern in the cell and the already routed wire do not overlap with each other in a same routing layer.

According to a further aspect of the present invention, there is provided a storage medium on which a cell placement program for an integrated circuit for placing cells in a state in which an already routed wire routed prior to the placement of the cells in order to design an integrated circuit having a plurality of routing layers by means of a computer is stored, the cell placement program causing the computer to function as search means for searching a position of any of the cells based on a routing state of the already routed wire stored in an already routed wire information storage section and a wiring pattern in the cell stored in a wiring pattern information storage section, and placement permission/rejection discrimination means for discriminating, when search for a position of any of the cells is performed by the search section, an overlapping state between the wiring pattern in the cell and the already routed wire at the position of the cell based on the routing state of the already routed wire of the already routed wire information storage section and the wiring pattern in the cell of the wiring pattern information storage section and permitting the placement of the cell at the position when the wiring pattern in the cell and the already routed wire do not overlap with each other in a same routing layer.

With the cell placement method and apparatus for an integrated circuit and the storage medium on which a cell placement program for an integrated circuit is stored described above, since routing layers which are not used by an already routed wire such as a bulk power supply wire or a clock signal wire are recognized and cells which use only such routing layers can be placed at positions at which they are overlapped with the already routed wire, it is possible to utilize a region overlapping with the already routed wire, which is not conventionally utilized, and a cell placement region can be assured and more cells can be disposed efficiently on one chip. Consequently, the cell placement method and apparatus and the storage medium according to the present invention contribute very much to an increase in density and function of an integrated circuit.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIGS. 5(a) and 5(b) are plan views schematically showing another result of simplification of the wiring patterns in the cells shown in FIGS. 3(a) and 3(b), respectively;

FIGS. 6(a) and 6(b) are diagrammatic views illustrating a result of calculation of a representative routing layer from the wiring patterns in the cells shown in FIGS. 3(a) and 3(b), respectively;

FIG. 8 is a diagrammatic view illustrating bulk power supply wire information (already routed wire information) calculated for each site unit hidden by the bulk power supply wire shown in FIG. 7;

DESCRIPTION OF THE PREFERRED EMBODIMENTS

A. Aspect of the Invention

Figure 1:
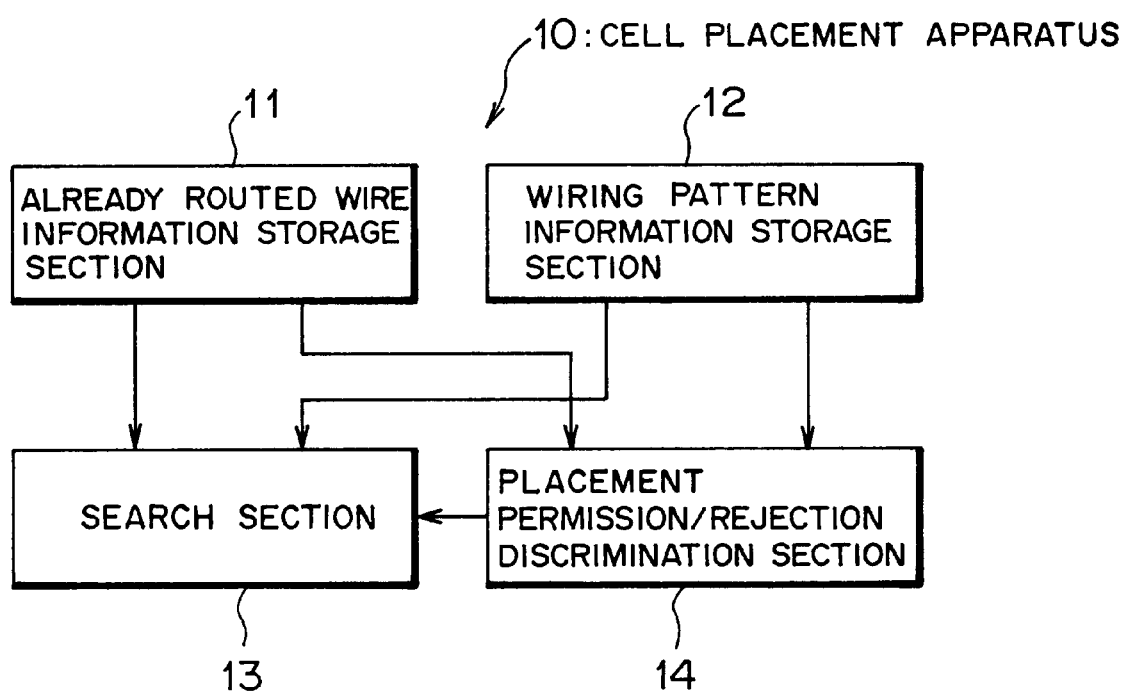
FIG. 1 is a block diagram showing an aspect of the present invention.

FIG. 1 is a block diagram illustrating a principle of the present invention. Referring to FIG. 1, a cell placement apparatus 10 according the present invention is designed so as to place a cell in a situation wherein an already routed wire routed prior to such cell placement is present in order to design an integrated circuit having a plurality of routing layers. To this end, the cell placement apparatus 10 includes an already routed wire information storage section 11, a wiring pattern information storage section 12, a search section 13 and a placement permission/rejection discrimination section 14.

The already routed wire information storage section 11 stores a routing state of an already routed wire. The wiring pattern information storage section 12 stores wiring patterns in cells. The search section 13 searches a position of a cell based on the routing state of an already routed wire in the already routed wire information storage section 11 and wiring patterns in cells of the wiring pattern information storage section 12.

The placement permission/rejection discrimination section 14 discriminates, when the searches section 13 search a position of a cell, an overlapping state between a wiring pattern in the cell and an already routed wire at the position of the cell based on a routing state of an already routed wire of the already routed wire information storage section 11 and wiring patterns in the cell of the wiring pattern information storage section 12, and permits placement of the cell to the position when the wiring patterns in the cell and the already routed wire do not overlap with each other in the same routing layer. It is to be noted that the search section 13 may additionally have the function of the placement permission/rejection discrimination section 14.

The cell placement apparatus 10 having such a construction may be constructed such that it further includes an individual site routing information calculation section for calculating, for each site unit corresponding to a basic cell size or the other unit size that the cells are placed along the grating, the routing layer of the already routed wire and those routing layers used in any of the cells based on the routing state of the already routed wire of the already routed wire information storage section 11 and the wiring patterns in the cell of the wiring pattern information storage section 12, and wherein the placement permission/rejection discrimination section 14 discriminates, for each site unit, an overlapping state between the wiring patterns in the cell and the already routed wire based on the routing layers of the site units calculated by the individual site routing information calculation section.

Further, the cell placement apparatus 10 may be constructed such that, where the already routed wire is routed only on the lower side or the upper side than a predetermined one of the plurality of routing layers, the individual site routing information calculation section calculates, for each site unit, an uppermost layer or a lowermost layer of those routing layers which are used in each of the cells as a representative routing layer and calculate, for each site unit, a lowermost layer or uppermost layer of routing which is routed for already routed wire as a representative layer, and the placement permission/rejection discrimination section 14 discriminates an overlapping state in the same routing layer between the wiring patterns in the cell and the already routed wire based on the representative routing layer of the cell calculated by the individual routing information calculation section and the routing layer of the already routed wire.

Furthermore, the cell placement apparatus may be constructed such that, where the already routed wire is routed in some layers from within first to nth layers which are the plurality of wiring layers, if the uppermost layer or lowermost layer among them is represented by m, m and n being natural numbers, the individual site routing information calculation section calculates, for each site unit, what numbered layer the upper layer or the lowermost layer from within the routing layers used by the cell is as a value x and stores the value x as information of the representative routing layer into a cell internal pattern information storage section, and calculates m for any site unit in which the already routed wire is present, but calculates n+1 for any site unit in which the already routed wire is not present, as another value y and stores the value y into the already routed wire information storage section 11, and the placement permission/rejection discrimination section 14 compares the values x and the values y with each other for each site unit and discriminates that the representative routing layer of cell and of the routing layer of the already routed wire do not overlap with each other when the values x of all of the site units of the cell at a position of the cell are lower than the values y of the corresponding site units. If the routing layer is counted from the upper side, it is discriminated not to overlap when the values x of all of the site units of the cell at the cell's position are upper than the values y of the corresponding site units.

Or, the cell placement apparatus may be constructed such that it further includes a cost calculation section for routing congestion when any of the cells is placed at a position obtained by the search of the search section 13 as a cost while taking also the already routed wire into consideration, and a cell movement permission/rejection discrimination section for permitting movement of the cell to the position only when the cost calculated by the calculation section exhibits a decrease or permitting, where the calculated cost is used for a requirement for movement in a simulated annealing method, the movement of the cell when the requirement for movement is satisfied.

In the cell placement apparatus 10 having such a construction as described above, when the search for a cell's position is performed by the search section, an overlapping state between wiring patterns in the cell and the already routed wire at a position of the cell is discriminated by the placement permission/prohibition discrimination section 14 based on the routing state of the already routed wire of the already routed wire information storage section 11 and the wiring patterns in the cell of the wiring pattern information storage section 12, and the placement of the cell at the position is permitted unless the wiring patterns in the cell and the already routed wire overlap with each other in a same routing layer.

Accordingly, unless wiring patterns in a cell and an already routed wire overlap with each other in a same routing layer, the cell can be placed at the position at which the cell overlaps with the already routed wire. In particular, those routing layers which are not used by an already routed wire such as a bulk power supply wire or a clock signal wire are recognized, and those cells which use only those recognized routing layers can be placed at positions at which they overlap with the already routed wire. Consequently, a larger cell placement area can be kept on a chip.

In this instance, where the placement permission/rejection discrimination section 14 discriminates, for each site unit, for example, corresponding to a basic cell size, an overlapping state between the wiring patterns in the cell and the already routed wire in the same routing layer, the discrimination processing for permission/rejection of the cell placement based on the overlapping state can be simplified.

Further, where the already routed wire is routed only on the lower side or the upper side than a predetermined one of the plurality of routing layers, since the individual site routing information calculation section calculates, for each site unit, an uppermost layer or a lowermost layer of those routing layers which are used in the cell as a representative routing layer and conversely a lowermost layer or an uppermost layer of routing for an already routed wire as a representative layer, and the placement permission/rejection discrimination section 14 discriminates an overlapping state in the same routing layer between the wiring patterns in the cell and the already routed wire based on the representative routing layer in the cell and the representative routing layer of the already routed wire, the discrimination processing for permission/rejection of the cell placement based on the overlapping state can be performed readily.

Furthermore, where the already routed wire is routed in some layers from within first to nth layers which are the plurality of wiring layers, the overlapping state between the routing layer used in the cell and the routing layer of the already routed wire can be discriminated only by comparison between the value x representative of an uppermost layer or a lowermost layer of those routing layers used in the cell, and the representative value y which is calculated for the already routed wire against the routing layer in the cell such that the lowermost or uppermost layer m (within the first to nth layers) if any layer is not used by the already routed wire, n+1 is set as y for each site unit, and the discrimination processing for permission/rejection of the cell placement based on the overlapping state can be performed more readily.

Where the cost calculation section calculates a congestion routing as a cost while taking also the already routed wire into consideration and the cell movement permission/rejection discrimination section permits movement of a cell only when the cost exhibits a decrease or permits, where a cost is used for a requirement for movement in a simulated annealing method, movement of a cell when the requirement for movement is satisfied, optimization of the cell placement (improvement in cell placement by movement of the cells) can be achieved while recognizing routing nearer to actual routing.

Meanwhile, a storage medium of the present invention stores a cell placement program for an integrated circuit for placing cells in a state in which an already routed wire routed prior to the placement of the cells in order to design an integrated circuit having a plurality of routing layers by means of a computer (cell placement apparatus 10), and the cell placement program causes the computer to function as (a) search means (search section 13) for searching a position of any of the cells based on a routing state of the already routed wire stored in the already routed wire information storage section 11 and wiring patterns in the cell stored in the wiring pattern information storage section 12, and (b) placement permission/rejection discrimination means (placement permission/rejection discrimination section 14) for discriminating, when search for a position of any of the cells is performed by the search means (search section 13), an overlapping state between the wiring patterns in the cell and the already routed wire at the position of the cell based on the routing state of the already routed wire of the already routed wire information storage section 11 and the wiring patterns in the cell of the wiring pattern information storage section 12 and permitting the placement of the cell at the position when the wiring patterns in the cell and the already routed wire do not overlap with each other in a same routing layer.

In this instance, the cell placement program may further cause the computer to function as individual site routing information calculation means for calculating, for each site unit, for example, corresponding to a basic cell size, the routing layer of the already routed wire and those routing layers used in any of the cells based on the routing state of the already routed wire of the already routed wire information storage section 11 and the wiring patterns in the cell of the wiring pattern information storage section 12, and when the cell placement program causes the computer to function as the placement permission/rejection discrimination means (placement permission/rejection discrimination section 14), the cell placement program may cause the computer to function so as to discriminate, for each site unit, an overlapping state between the wiring patterns in the cell and the already routed wire based on the routing layers of the site units calculated by the individual site routing information calculation means.

Further, where the already routed wire is routed only on the lower side or the upper side than a predetermined one of the plurality of routing layers, the cell placement program may cause, when the cell placement program causes the computer to function as the individual site routing information calculation means, the computer to function so as to calculate, for each site unit, an uppermost layer or a lowermost layer of those routing layers which are used in any of the cells as a representative routing layer, and cause, when the cell placement program causes the computer to function as the the placement permission/rejection discrimination means (placement permission/rejection discrimination section 14), the computer to function so as to discriminate an overlapping state in the same routing layer between the wiring patterns in the cell and the already routed wire based on the representative routing layer of the cell calculated by the individual routing information calculation means and the representative routing layer of the already routed wire.

Furthermore, where the already routed wire is routed in some layers from within first to nth layers which are the plurality of wiring layers and m represents a representative layer which is (against the routing layer in the cell) a lowermost or uppermost layer of routing, m being a natural number, the cell placement program may cause, when the cell placement program causes the computer to function as the individual site routing information calculation section, the computer to function so as to calculate, for each site unit, what numbered layer the upper layer or the lowermost layer from within the routing layers used in the cell is as a value x and store the value x as information of the representative routing layer into a cell internal pattern information storage section, and calculate m for any site unit in which the already routed wire is present, but calculate n+1 for any site unit in which the already routed wire is not present, as another value y and store the value y into the already routed wire information storage section, and cause, when the cell placement program causes the computer to function as the placement permission/rejection discrimination means (placement permission/rejection discrimination section 14), the computer to function so as to compare the values x and the values y with each other for each site unit and discriminate that the representative routing layer and the representative routing layer of the already routed wire do not overlap with each other when the values x of all of the site units of the cell at a position of the cell are lower than the values y of the corresponding site units. If the routing layer is counted from the upper side, it is where there is no already routed wire, 0 is set in place of n+1, and it is discriminated not to overlap when x>y.

Or, the cell placement program may further cause the computer to function as cost calculation means for calculating a routing congestion when any of the cells is placed at a position obtained by the search of the search means (search section 13) as a cost while taking also the already routed wire into consideration, and cell movement permission/rejection discrimination means for permitting movement of the cell to the position only when the cost calculated by the calculation section exhibits a decrease or permitting, where the cost is used for a requirement for movement in a simulated annealing method, the movement of the cell when the requirement for movement is satisfied.

With the cell placement method and apparatus for an integrated circuit and the storage medium on which a cell placement program for an integrated circuit is stored described above, the following effects or advantages can be achieved.

1. Since routing layers which are not used by an already routed wire such as a bulk power supply wire or a clock signal wire are recognized and cells which use only such routing layers can be placed at positions at which they are overlapped with the already routed wire, it is possible to utilize an area overlapping with the already routed wire, which is not conventionally utilized, and a cell placement area can be assured and more cells can be disposed efficiently on one chip. This contributes very much to an increase in density and function of an integrated circuit.

2. Since an overlapping state between wiring patterns in each cell and an already routed wire in a same routing layer is discriminated for each site unit, for example, corresponding to a basic cell size, discrimination processing for permission/rejection of placement of the cell can be simplified, and high density placement of cells is allowed without suffering from an increase in processing time.

3. Where an already routed wire is routed only on the lower side or the upper side than a predetermined one of a plurality of routing layers, since an uppermost layer or a lowermost layer of those routing layers which are used in any cell is calculated as a representative routing layer for each site unit, and against cell's pattern, the lowermost layer of uppermost layer of the already routed wire calculated as a representative layer for each site unit, and an overlapping state between wiring patterns in the cell and the already routed wire in a same routing layer is discriminated based on the representative routing layer and the representative routing layer of the already routed wire, discrimination processing for permission/rejection of the cell placement based on the overlapping state can be performed readily in a short time.

4. Where an already routed wire is routed in some layers, since an overlapping state between a used layer in the cell and the routing layer of the already routed wire can be discriminated only by comparison between a value x representative of an uppermost layer of those routing layers used in any cell and another value y calculated for the representative of a lowermost layer of an already routed wire for each site unit, or x representative of a lowermost layer in any cell and y representative of an uppermost layer of the already routed wire, discrimination processing for permission/ rejection of the cell placement based on the overlapping state can be performed very readily in a short time.

5. Where a routing congestion is calculated as a cost while taking also an already routed wire into consideration, optimization of a cell placement can be achieved while recognizing routing nearer to actual routing, and a placement result of a high routing performance can be obtained.

B. Embodiment of the Invention

A preferred embodiment of the present invention is described below with reference to the drawings.

Figure 2:
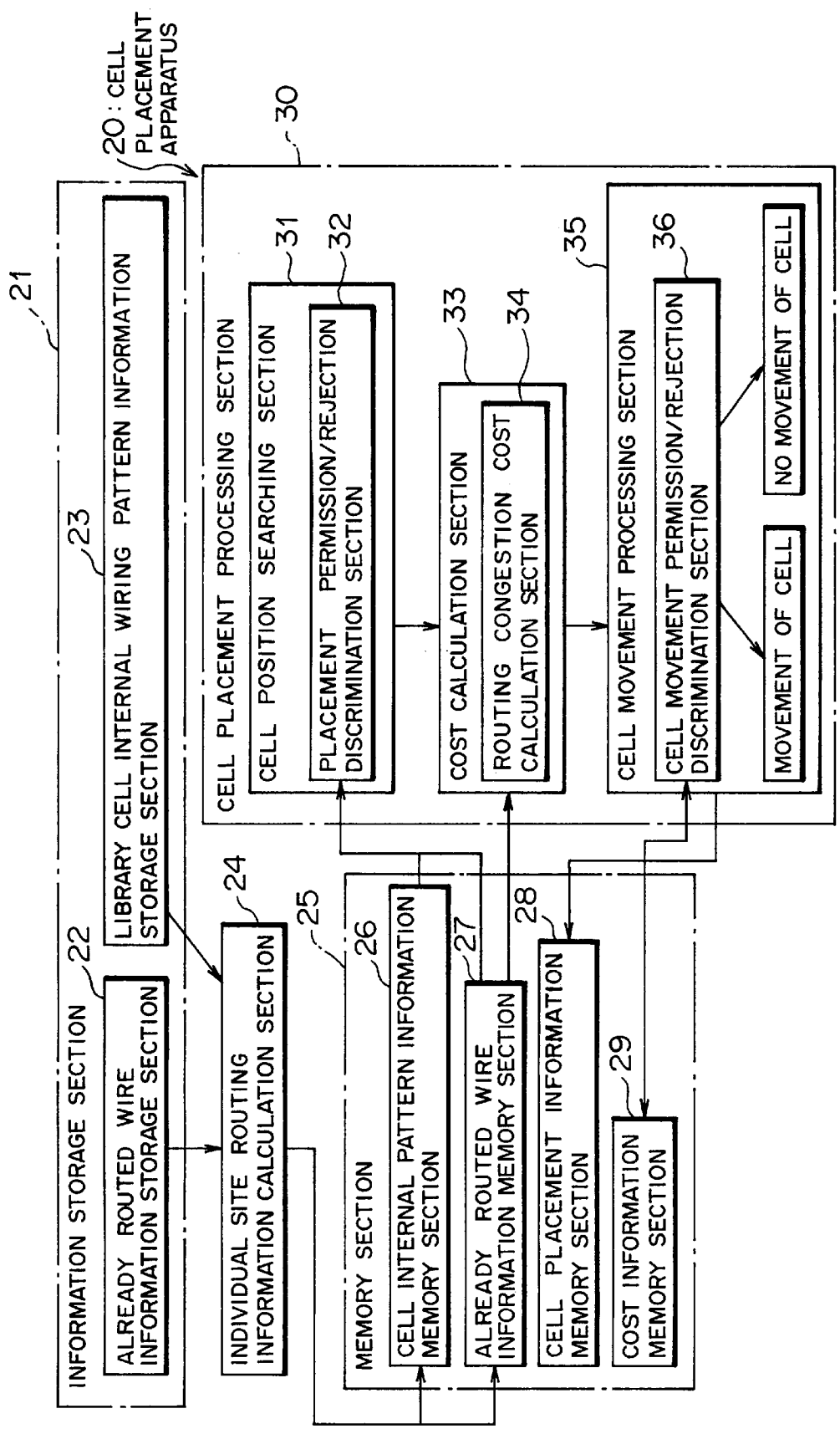
FIG. 2 is a block diagram showing a construction of a cell placement apparatus as a preferred embodiment of the present invention.
Figure 13:
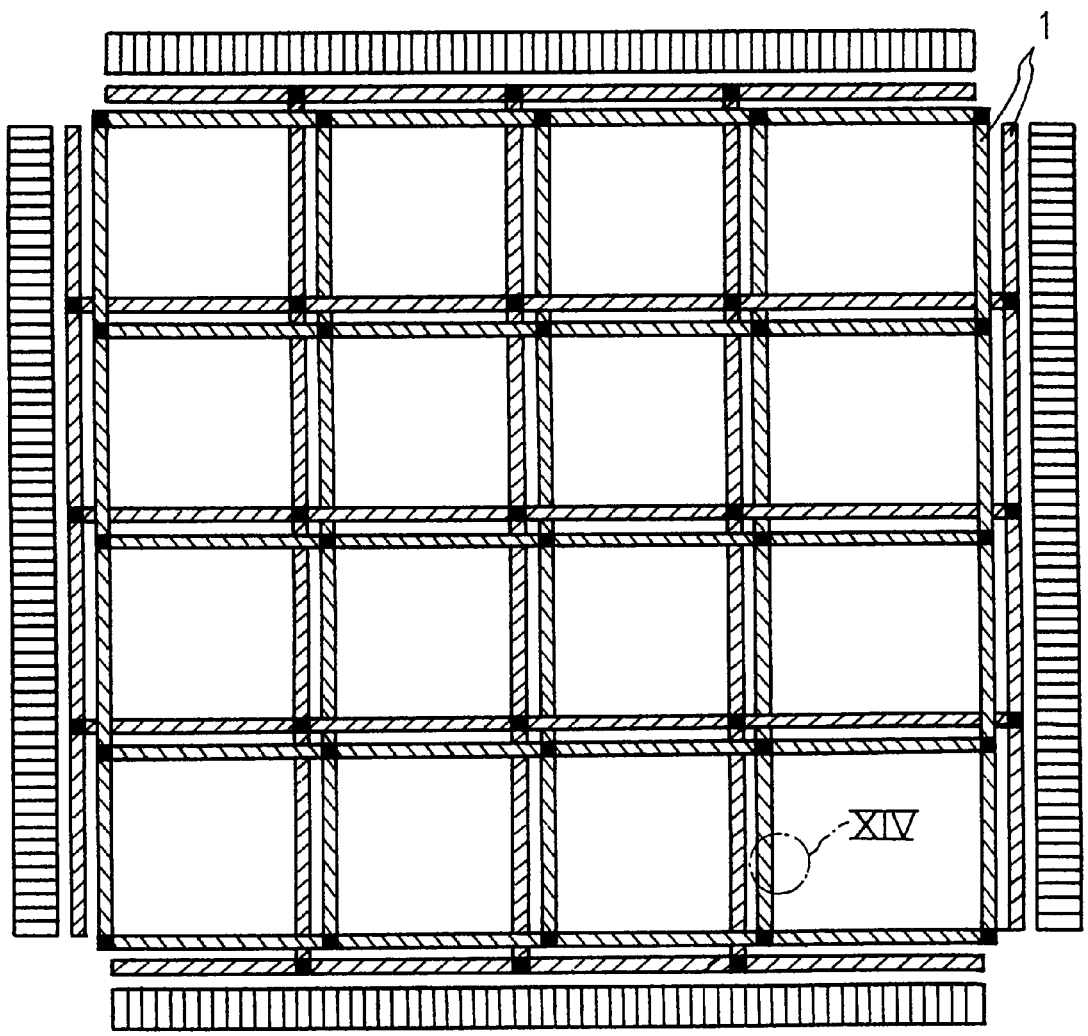
FIG. 13 is a plan view showing an example of a bulk power supply wire (already routed wire)
Figure 14:
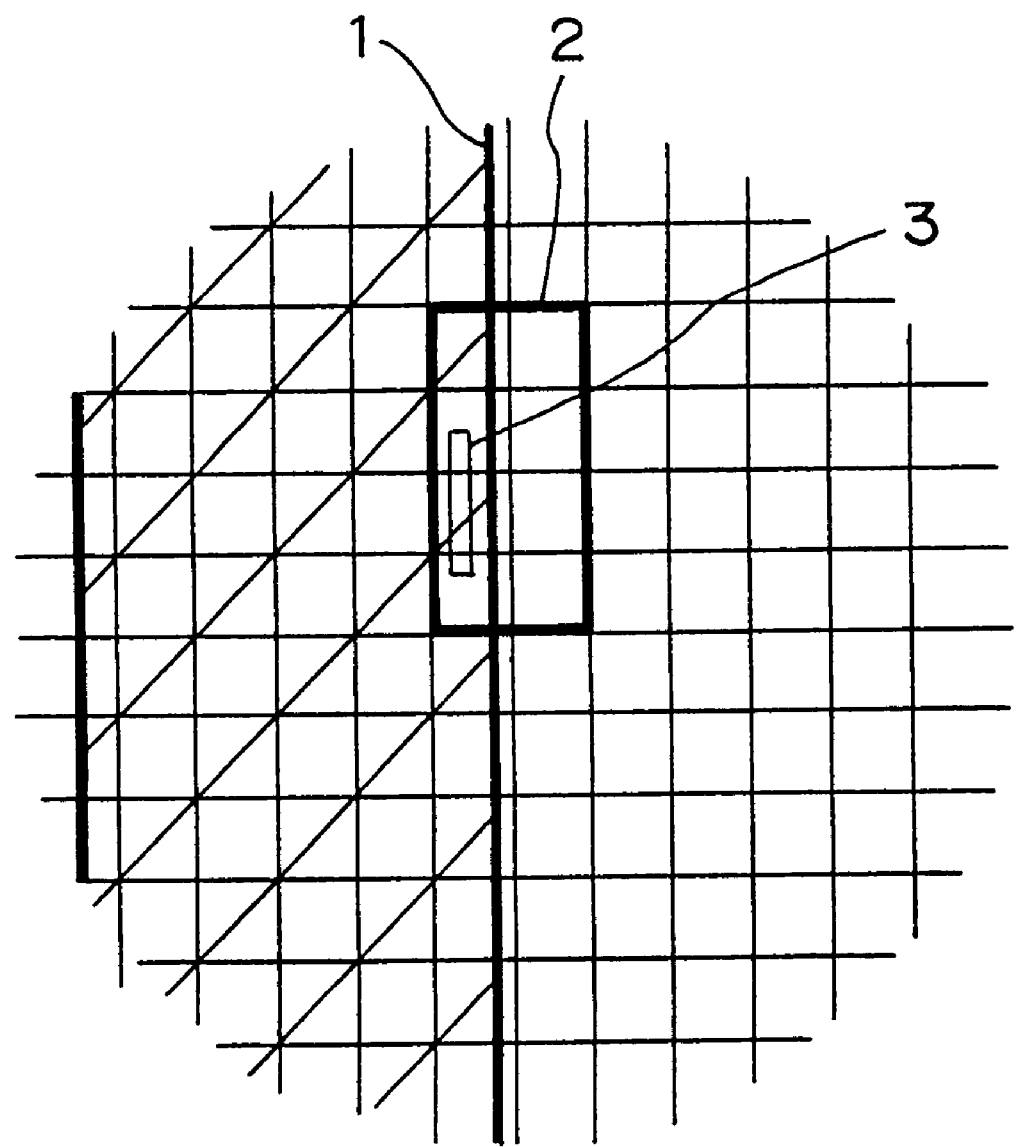
FIG. 14 is an enlarged view of a XIV portion of FIG. 13.

FIG. 2 shows in block diagram a construction of a cell placement apparatus as a preferred embodiment of the present invention. Referring to FIG. 2, the cell placement apparatus 20 of the present embodiment shown is designed so as to place a cell 2 (2A or 2B; refer to FIGS. 3(a) to 5(b) and 14) in a situation wherein a bulk power supply wire 1 (refer to FIGS. 7 and 13; an already routed wire) routed prior to such cell placement is present in order to design an LSI (integrated circuit) having a plurality of (three in the present embodiment) routing layers. To this end, the cell placement apparatus 20 includes an information storage section 21, an individual site routing information calculation section 24, a memory section 25 and a cell placement processing section 30.

It is to be noted that the individual site routing information calculation section 24, memory section 25 and cell placement processing section 30 are functionally realized by a terminal equipment such as a personal computer or a work station.

Particularly, the individual site routing information calculation section 24 and the cell placement processing section 30 in the present embodiment are actually realized by a computer which reads out a cell placement program stored on a storage medium such as a hard disk, a magnetic tape, a floppy disk, an optical disk, a magneto-optical disk or a CD-ROM and executes the program. The cell placement program causes the computer to function as the components denoted by reference numerals 24 and 30 (31 to 36) in FIG. 2.

The information storage section 21 is formed as a data base in which necessary information is stored in advance. The information storage section 21 includes a power supply wire information storage section (already routed wire information storage section) 22 and a library cell internal wiring pattern information storage section (wiring pattern information storage section) 23. The power supply wire information storage section 22 stores a routing line state (information regarding a routing layer, a routed wire area and so forth) of the bulk power supply wire 1. The library cell internal wiring pattern information storage section 23 stores information (routing layers, wire positions and so forth) regarding wiring patterns in a plurality of kinds of cells (library cells) used in designing of an LSI.

The individual site routing information calculation section (individual site routing information calculation means) 24 calculates, for each site unit corresponding to a basic cell size, the routing layer of the bulk power supply wire 1 and routing layers used in the cells 2 (2A and 2B) based on the routing state of the bulk power supply wire 1 of the power supply wire line information storage section 22 and the wiring patterns in the cells 2 of the library cell internal wiring pattern information storage section 23.

In the present embodiment, it is assumed that the bulk power supply wire 1 routed in the third layer which is the uppermost layer from within three routing layers (first to third layers), and the individual site wire information calculation section 24 calculates, for each site unit, what numbered layer the uppermost one of those routing layers used in each cell 2 (2A or 2B) and stores a result of the calculation as information of a representative routing layer (value x, which will be hereinafter described with reference to FIGS. 3(a) to 6(b)) into a cell internal pattern information memory section 26, which will be hereinafter described. Further, the individual site routing information calculation section 24 calculates, for any site unit in which the bulk power supply wire 1 is present, 3 which is the number of the routing layer of the bulk power supply wire 1, but calculates, for any site unit in which the bulk power supply wire 1 is not present, a value of a sum of the total routing layer number and 1, that is, 3+1=4, and stores the calculated value as power supply routing information (a value y, which will be hereinafter described with reference to FIGS. 7 and 8) into a power supply routing information memory section 27, which will be hereinafter described.

The memory section 25 includes a cell internal pattern information memory section 26, a power supply routing information memory section (already routed wire information memory section) 27, a cell placement information memory section 28 and a cost information memory section 29.

The cell internal pattern information memory section 26 stores, for each site unit of each cell, information (a value x) of a representative routing layer calculated by the individual site routing information calculation section 24 as described above. The power supply routing information memory section 27 stores, for each site unit, power supply routing information (a value y) calculated by the individual site routing information calculation section 24 as described above.

The cell placement information memory section 28 stores place information regarding positions of the cells 2 (2A and 2B) determined by the cell placement processing section 30 described below. The cost information memory section 29 stores costs calculated by a cost calculation section 33 which will be hereinafter described.

The cell placement processing section 30 performs placement processing of a cell 2 (2A or 2B) based on various information stored in the memory section 25 and includes a cell position searching section (search section, search means) 31, a cost calculation section (cost calculation means) 33 and a cell movement processing section 35.

The cell position searching section 31 searches a candidate of a position (destination of movement) of each cell 2 (2A or 2B) based on information of the cell internal pattern information memory section 26 and the power supply wire information memory section 27. More particularly, as hereinafter described with reference to FIG. 12, the cell placement destination search section 31 searches, upon initial placement of the cells 2 (2A and 2B) (refer to step 2 of FIG. 12), for a position of each cell 2 (2A or 2B) to decide it at random, but searches and selects, when improvement in placement is to be performed in order to optimize the placement state of the cells 2 (2A and 2B), a destination of movement (position) of each cell 2 (2A or 2B) based on a normal distribution (refer to step S5 of FIG. 12).

The cell placement destination search section 31 in the present embodiment includes a placement permission/ rejection discrimination section (placement permission/ rejection discrimination means) 32. The placement permission/rejection discrimination section 32 discriminates, when the cell placement destination search section 31 searched and selects a position of each cell 2 (2A or 2B), based on information of the cell internal pattern information memory section 26 and the power supply wire information memory section 27, whether or not the bulk power supply wire 1 and the wiring patterns 3 of the cell 2 (2A or 2B) overlap with each other at the cell placement destination candidate obtained by the search. Then, if the bulk power supply wire 1 and the wiring patterns 3 do not overlap with each other, then the cell placement destination search section 31 permits the placement of the cell 2 (2A or 2B) to the position.

In this instance, as hereinafter described with reference to FIGS. 9 and 10, the placement permission/rejection discrimination section 32 in the present embodiment compares, for each site unit, the values x of the cell internal pattern information memory section 26 and the values y of the power supply wire information memory section 27 with each other and discriminates, when the values x of all of the site units of the cell 2 (2A or 2B) at the position of the cell 2 (2A or 2B) are lower than the values y of the corresponding site units, that the wiring patterns 3 in the cell 2 (2A or 2B) and the bulk power supply wire 1 do not overlap each other. It is to be noted that, while the placement permission/rejection discrimination section 32 in the present embodiment is included in the cell placement destination search section 31, it may otherwise be provided externally of and additionally to the cell placement destination search section 31.

The cost calculation section 33 calculates a cost when a cell 2 (2A or 2B) is moved to a position selected by the cell placement destination search section 31, and includes a routing congestion cost calculation section 34.

The routing congestion cost calculation section 34 calculates, when a cell 2 (2A or 2B) is moved to a position selected by the cell placement destination search section 31, a congestion of routing which interconnects the cell 2 (2A or 2B) and other cells as a cost taking also the bulk power supply wire 1 into consideration. In the present embodiment, the routing congestion cost calculation section 34 calculates the number of routing grids filled up by the bulk power supply wire 1 in addition to the cost of a routing congestion as hereinafter described with reference to FIG. 11.

The cell movement processing section 35 performs processing of moving a cell 2 (2A or 2B) to a position selected by the cell placement destination search section 31, and includes a cell movement permission/rejection discrimination section 36.

The cell movement permission/rejection discrimination section (cell movement permission/rejection discrimination means) 36 discriminates based on a cost calculated by the cost calculation section 33 whether or not a cell 2 (2A or 2B) should be moved to a position selected by the cell placement destination search section 31. In particular, the cell movement permission/rejection discrimination section 36 reads out a cost calculated in the preceding operation cycle for a cell 2 (2A or 2B) of an object of discrimination from the cost information memory section 29, compares the cost in the preceding operation cycle and another cost calculated by the cost calculation section 33 in the current operation cycle with each other, and permits the movement of the cell 2 (2A or 2B) to the position (destination of movement) only when the cost in the current operation cycle is lower than the cost in the preceding operation cycle. It is to be noted that a cost calculated by the cost calculation section 33 may be used as a cost for a requirement of movement of a cell 2 in a simulated annealing method or the like.

If movement is permitted by the cell movement permission/rejection discrimination section 36, then cell movement processing is executed by the cell movement processing section 35, and a cost calculated in the current operation cycle is recorded into the cost information memory section 29. On the other hand, if such movement is not permitted by the cell movement permission/rejection discrimination section 36, then the cell movement processing section 35 does not perform cell movement processing.

Subsequently, a basic operation of the cell placement apparatus 20 of the present embodiment having such a construction as described above will be described with reference to the flow chart shown in FIG. 12 (steps S1 to S12) and FIGS. 3(a) to 11.

First, routing line information of the bulk power supply wire 1 and wiring pattern information in the library cells 2 are read in from the power supply wire information memory section 22 and the library cell internal wiring pattern information memory section 23 of the information storage section 21 which serves as a data base.

Then, the individual site routing information calculation section 24 calculates, for each site unit, what numbered layer the uppermost layer from within routing layers used in each cell 2 (2A or 2B) is and calculates what numbered layer the lowermost layer from within the layers in which the bulk power supply wire 1 is present is. In the present embodiment, since it is assumed that the bulk power supply wire 1 is present in the uppermost layer (third layer) as described hereinabove, the lowermost layer from within the layers in which the bulk power supply wire 1 is present as calculated by the individual site routing information calculation section 24 is always the third layer.

After calculation what numbered layer is used in each site unit in this manner, the layer number (value x) calculated for each cell 2 (2A or 2B) is stored, for each basic cell (site unit), as information of a representative routing layer into the cell internal pattern information memory section 26, and the layer number (value y) calculated for the bulk power supply wire 1 is stored, for each site unit of the base site, as power supply wire information of a representative layer into the power supply wire information memory section 27.

In this instance, the power supply wire information memory section 27 records, for any site unit in which the bulk power supply wire 1 is present, the layer number (3 in the present embodiment) of the lowermost one of the layers in which the bulk power supply wire 1 is routed, but records, for any site unit in which the bulk power supply wire 1 is not present, a value of a sum (in the present embodiment, 4) of the total number of the routing layers of the chip and 1. Further, the cell internal pattern information memory section 26 records, for any site unit (basic cell) in which a wiring pattern 3 is present, the layer number (1 to 3) of the uppermost one of the layers in which the wiring pattern 3 is routed, but records, for any site unit (basic cell) in which no wiring pattern 3 is present, 0 (step S1 of FIG. 12).

Here, more detailed examples of the cells 2A and 2B and the bulk power supply wire 1 are described with reference to FIGS. 3(a) to 8.

Figure 3A:
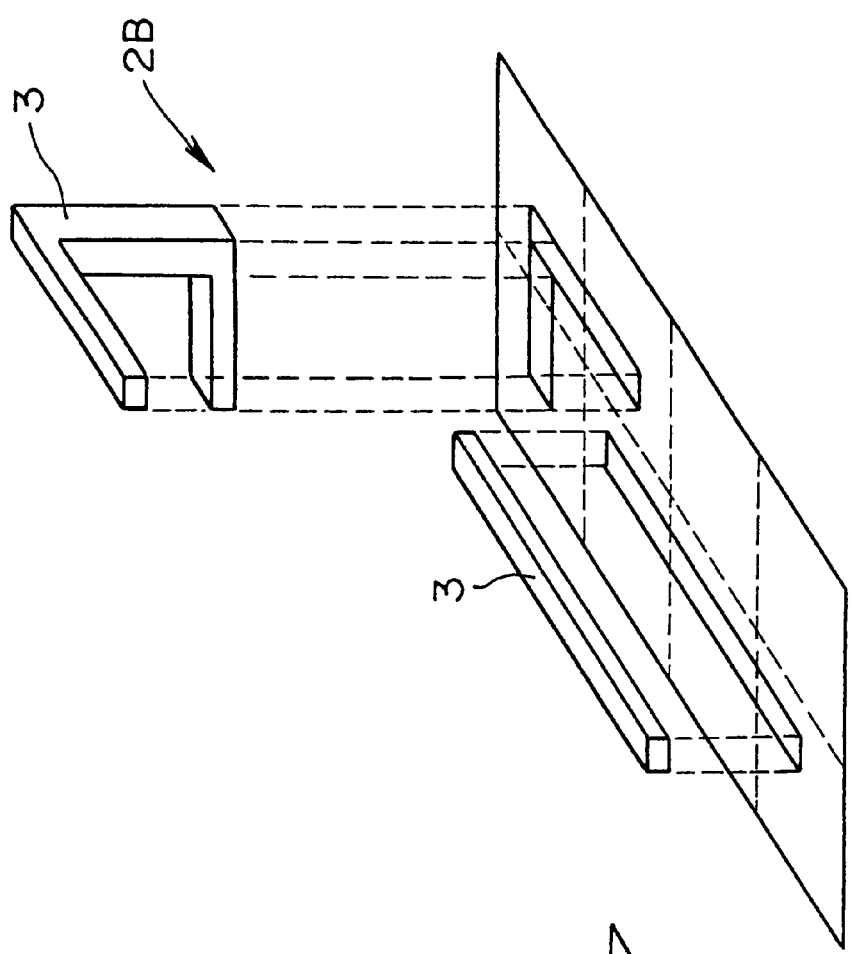
FIGS. 3(a) and 3(b) are perspective views schematically showing different examples of a wiring pattern in a cell.
Figure 3B:
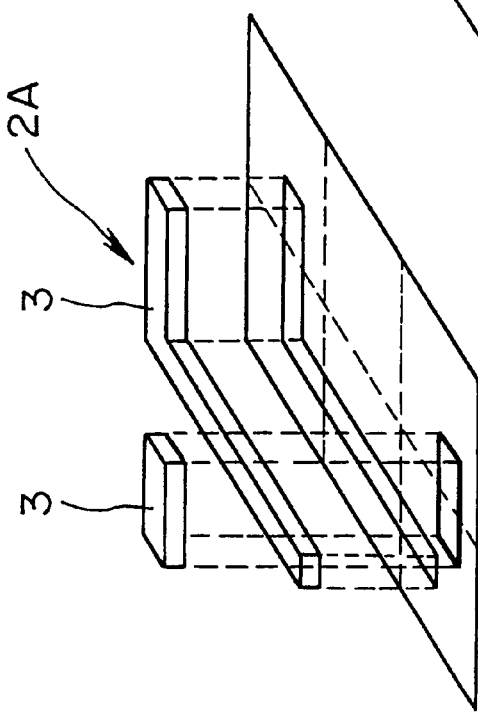
Figure 4B:
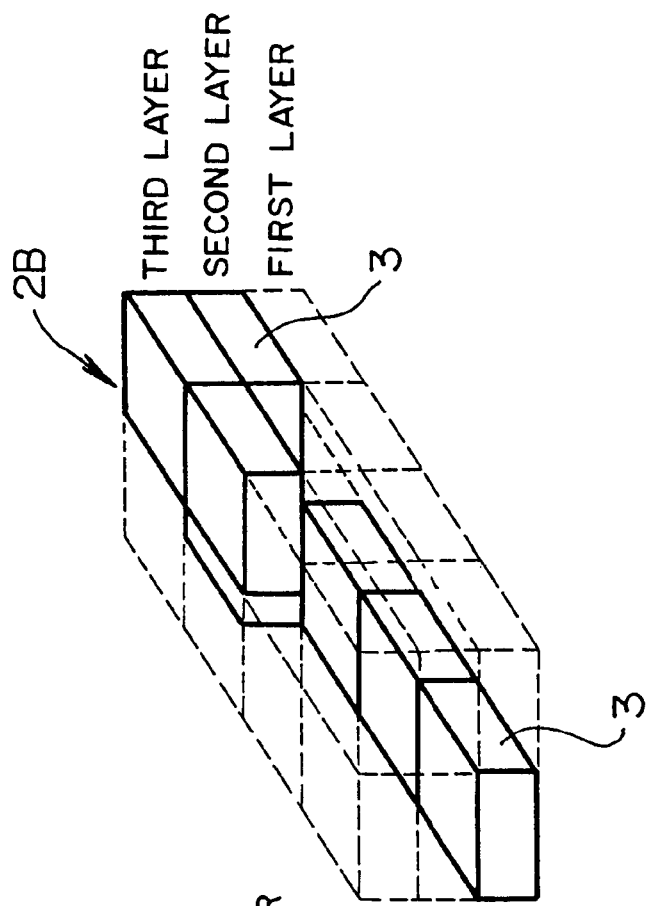
FIGS. 4(a) and 4(b) are perspective views schematically showing a result of simplification of the wiring patterns in the cells shown in FIGS. 3(a) and 3(b), respectively.
Figure 4A:
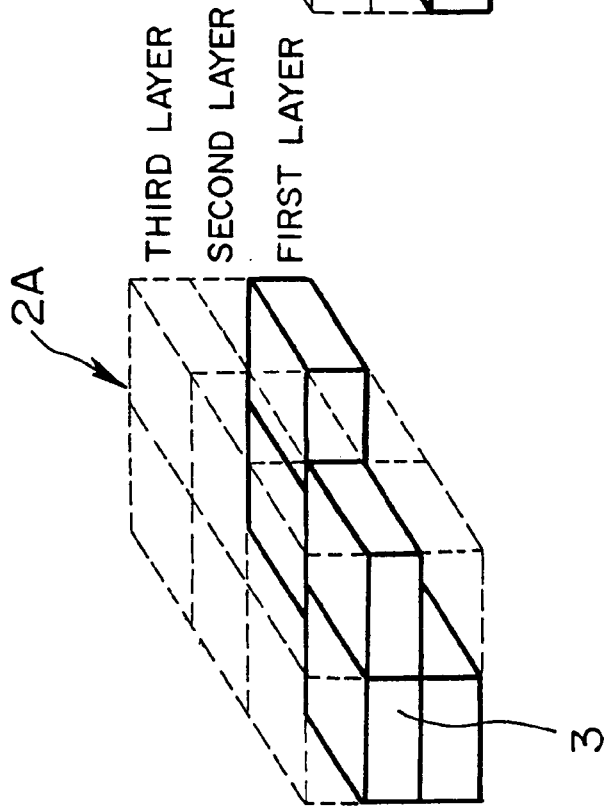

FIGS. 3(a) and 3(b) are perspective views schematically showing examples of wiring patterns 3 in the cells 2A and 2B, respectively. The cell 2A has wiring patterns 3 in the first and second layers as seen in FIG. 3(a), and the cell 2B has wiring patterns 3 in all of the first to third layers as seen in FIG. 3(b). It is to be noted that the size of one grating shown at a lower portion of each of FIGS. 3(a) and 3(b) is the size of a basic cell, and one grating is a site unit.

Results of simplification/clarification of the routing layer information of the wiring patterns 3 of the cells 2A and 2B shown in FIGS. 3(a) and 3(b) are shown in FIGS. 4(a), 4(b) and 5(a), 5(b), respectively. In particular, in each of FIGS.

4(*a*) and 4(*b*), it is three-dimensionally clarified whether or not a wiring pattern 3 is present in each site unit of each routing layer of the cell 2A or 2B. Meanwhile, in each of FIGS. 5(*a*) and 5(*b*), it is two-dimensionally clarified for each site unit of each routing layer of the cell 2A or 2B which one of the first to third layers the uppermost layer of each wiring pattern 3 is. It is to be noted that one division shown in FIG. 4(*a*) or 4(*b*) or one grating shown in FIG. 5(*a*) or 5(*b*) is a site unit corresponding to a basic cell.

Accordingly, for each of such cells 2A and 2B as shown in FIGS. 4(*a*), 4(*b*) and 5(*a*), 5(*b*), such values as seen in FIGS. 6(*a*) and 6(*b*) (values indicating the most upper layers used in each cell 3) are calculated as information of representative routing layers for each site unit (basic cell) by the individual site routing information calculation section 24. The values are stored into the cell internal pattern information memory section 26. In particular, for such a cell 2A as illustrated in FIG. 6(*a*), the values of 0 to 2 are stored, and for such a cell 2B as illustrated in FIG. 6(*b*), the values of 0 to 3 are stored, for each site unit. For a site unit in which no wiring pattern 3 is present, the value of 0 is set as described hereinabove.

Figure 7:
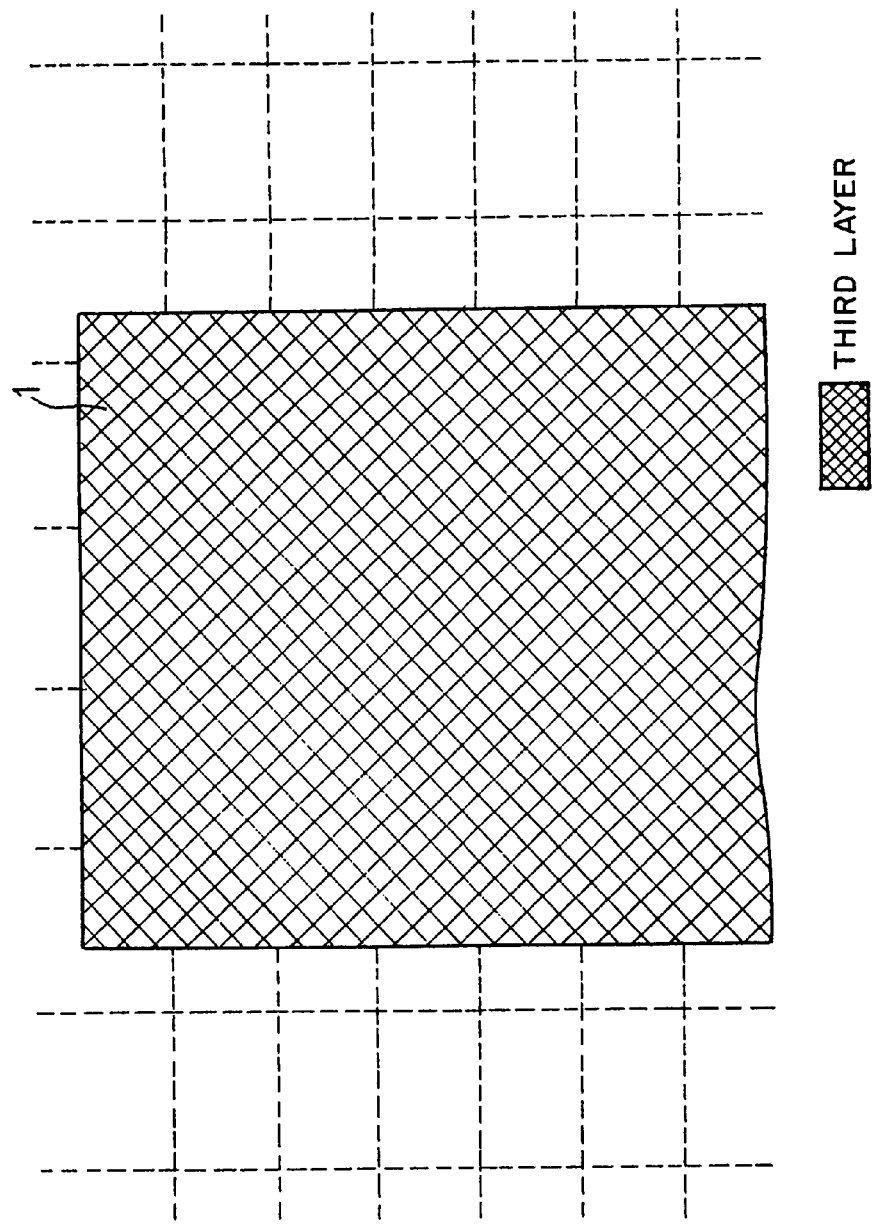
FIG. 7 is a plan view showing a routing layer of a bulk power supply wire.

FIG. 7 shows in plan view the routing layer of the bulk power supply wire 1. As seen from FIG. 7, in the present embodiment, the bulk power supply wire 1 is routed in the third layer. It is to be noted that one grating shown in FIG. 7 is a site unit, and as seen in FIG. 7, different from the cells 2 (2A and 2B), the bulk power supply wire 1 is routed at an arbitrary position without extending along frames of site units.

Then, for such a bulk power supply wire 1 as shown in FIG. 7, such values as seen in FIG. 8 (values representative of the lowermost layers of the routing layers used by the bulk power supply wire 1) are calculated as power supply wire information for each site unit by the individual site routing information calculation section 24. The values are stored into the power supply wire information memory section 27. For each site unit in which the bulk power supply wire 1 is not present, the value of 4 which is equal to the sum of the total wire number and 1 is set as described hereinabove. It is to be noted that, also in FIG. 8, one grating is a site unit corresponding to a basic cell.

After various information necessary for cell placement is calculated and stored into the cell internal pattern information memory section 26 and the power supply wire information memory section 27 in such a manner as described above (step S1 of FIG. 12), initial placement of the cells 2A and 2B is performed by the cell placement processing section 30 (step 2 of FIG. 12).

In this instance, search for destinations of placement of the cells 2 (2A and 2B) is performed by the cell placement destination search section 31 and decided at random. Although, upon cell placement, a cell placement prohibition is conventionally generated in the entire area through which the bulk power supply wire 1 passes, in the present embodiment, no cell placement prohibition is generated at all.

In the present embodiment, however, upon search for a position by the cell placement destination search section 31, it is discriminated by the placement permission/rejection discrimination section 32 based on the information of the cell internal pattern information memory section 26 and the power supply wire information memory section 27 whether or not the cell 2A or 2B can be placed at the position.

In particular, when the lowermost layer (third layer) of the bulk power supply wire 1 stored in a site unit of the position to which it is tried to place the cell 2A or 2B is positioned higher than the uppermost layer used by the corresponding site of the library cell 2A or 2B, the placement permission/rejection discrimination section 32 permits the placement of the cell to the position, but when the lowermost layer is lower than the uppermost layer, the placement permission/rejection discrimination section 32 rejects the placement of the cell to the position.

Criteria employed by the placement permission/rejection discrimination section 32 are described with reference to FIGS. 9 and 10 taking a case wherein the cells 2A and 2B described hereinabove with reference to FIGS. 3(*a*) to 6(*b*) are placed around the bulk power supply wire 1 shown in FIGS. 7 and 8.

Where it is tried to place the cells 2A and 2B in an overlapping relationship in an area (area of the value of 3) in which the bulk power supply wire 1 passes, the values (layer numbers) 0 to 2 of the routing layers regarding the site units of the cell 2A are all lower than the value of 3 of the site units corresponding to the base site. In particular, since the wiring pattern 3 in the cell 2A do not overlap and do not short-circuit with the bulk power supply wire 1, it is possible to place the cell 2A at the position shown in FIGS. 9 and 10, and the placement is permitted by the placement permission/rejection discrimination section 32.

Figure 9:
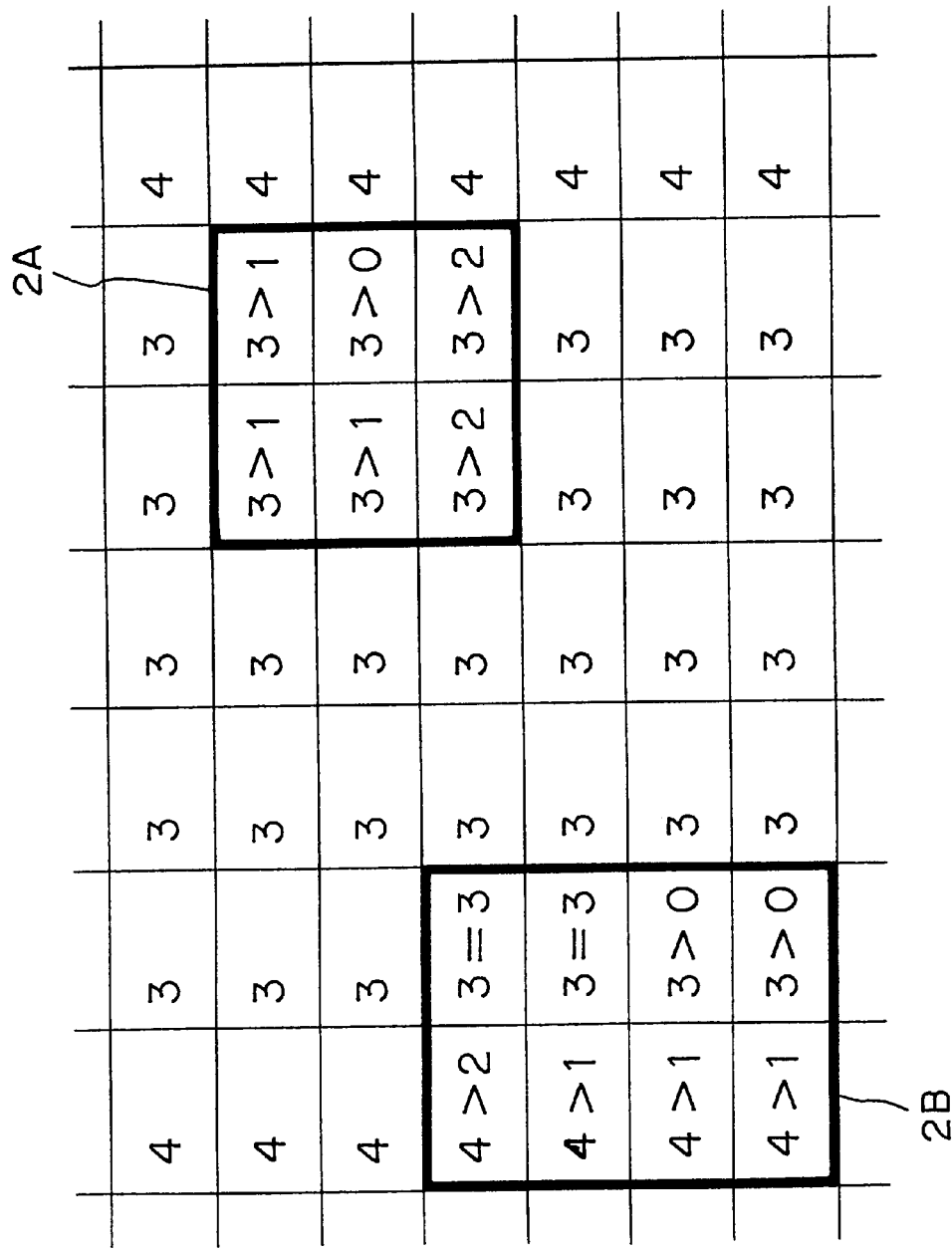
FIG. 9 is a diagrammatic view illustrating a discrimination procedure for permission of placement of a cell employed in the cell placement apparatus shown in FIG. 2.
Figure 10:
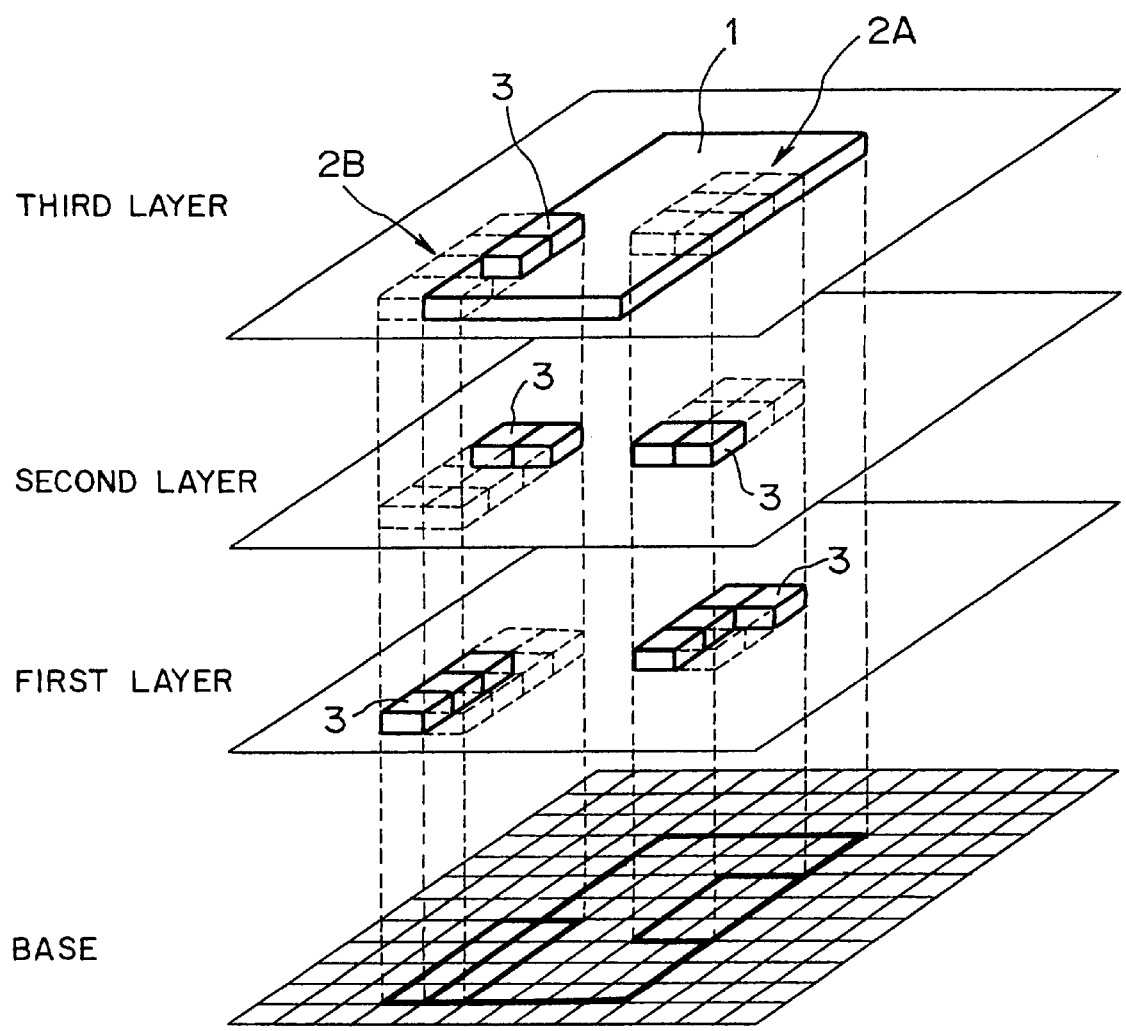
FIG. 10 is a schematic perspective view showing an overlapping state of wiring patterns in a cell and a bulk power supply wire.

On the other hand, with the cell 2B, the value (layer number) of 3 of two site units at the two upper right gratings in FIG. 9 coincide with the value of 3 of the base site. In particular, as seen from FIG. 10, the wiring pattern 3 in the cell 2B and the bulk power supply wire 1 overlap with each other in the same routing layer (third layer) and cause short-circuiting therebetween. Consequently, the cell 2B cannot be placed at the position shown in FIG. 10, and the placement of the cell 2B is rejected by the placement permission/rejection discrimination section 32. In this instance, search for another position of the cell 2B is performed by the cell placement destination search section 31.

After initial placement of the cells 2 (2A and 2B) is performed in such a manner as described above (step S2 of FIG. 12), calculation of costs is performed for the initial placement state by the cost calculation section 33, and resulting values of the calculation are stored as initial values into the cost information memory section 29 (initialization for costs; step S3 of FIG. 12). Then, placement improvement processing (steps S4 to S11 of FIG. 12) for the thus initially placed cells 2 (2A and 2B) is performed.

In particular, one of the initially placed cells 2 (2A and 2B) is selected (step S4 of FIG. 12) and a destination of movement (position) is suitably selected in accordance with a normal distribution or the like (step S5 of FIG. 12) by the cell placement destination search section 31. Also in this instance, using a procedure similar to the procedure described hereinabove with reference to FIGS. 9 and 10, it is discriminated by the placement permission/rejection discrimination section 32 whether or not the cell 2 (2A or 2B) can be moved to and placed at the candidate for movement, and search for a destination of movement is performed until a candidate to which the cell 2 (2A or 2B) can be placed is selected.

After a candidate to which the cell 2 (2A or 2B) can be placed is selected, a cost for the case wherein the cell 2 (2A or 2B) is placed to the selected movement destination is calculated by the cost calculation section 33 (step S6).

In this instance, in the present embodiment, a routing congestion is calculated as a cost by the routing congestion cost calculation section 34 of the cost calculation section 33 taking also the bulk power supply wire 1 into consideration.

A procedure of calculation of a routing congestion is described in more detail. In the present embodiment, a counted number of routing grids overlaid by the bulk power supply wire 1 is stored as power supply wire information in the power supply wire information memory section 27 in advance.

Then, based on a sum total of the number of routing grids overlaid by the bulk power supply wire 1, the number of routing grids overlaid by the wiring patterns 3 in the cell 2 when the cell 2 is placed and the number of routing estimated as provisional route, the number of routing crossing boundaries of meshes sectioned at equal intervals (refer to gratings of FIG. 11; the meshes are set larger than the site unit) is calculated and a cost is provided for a difference between the crossing route number and a possible number to route on the mesh boundaries by the routing congestion cost calculation section 34.

Figure 11:
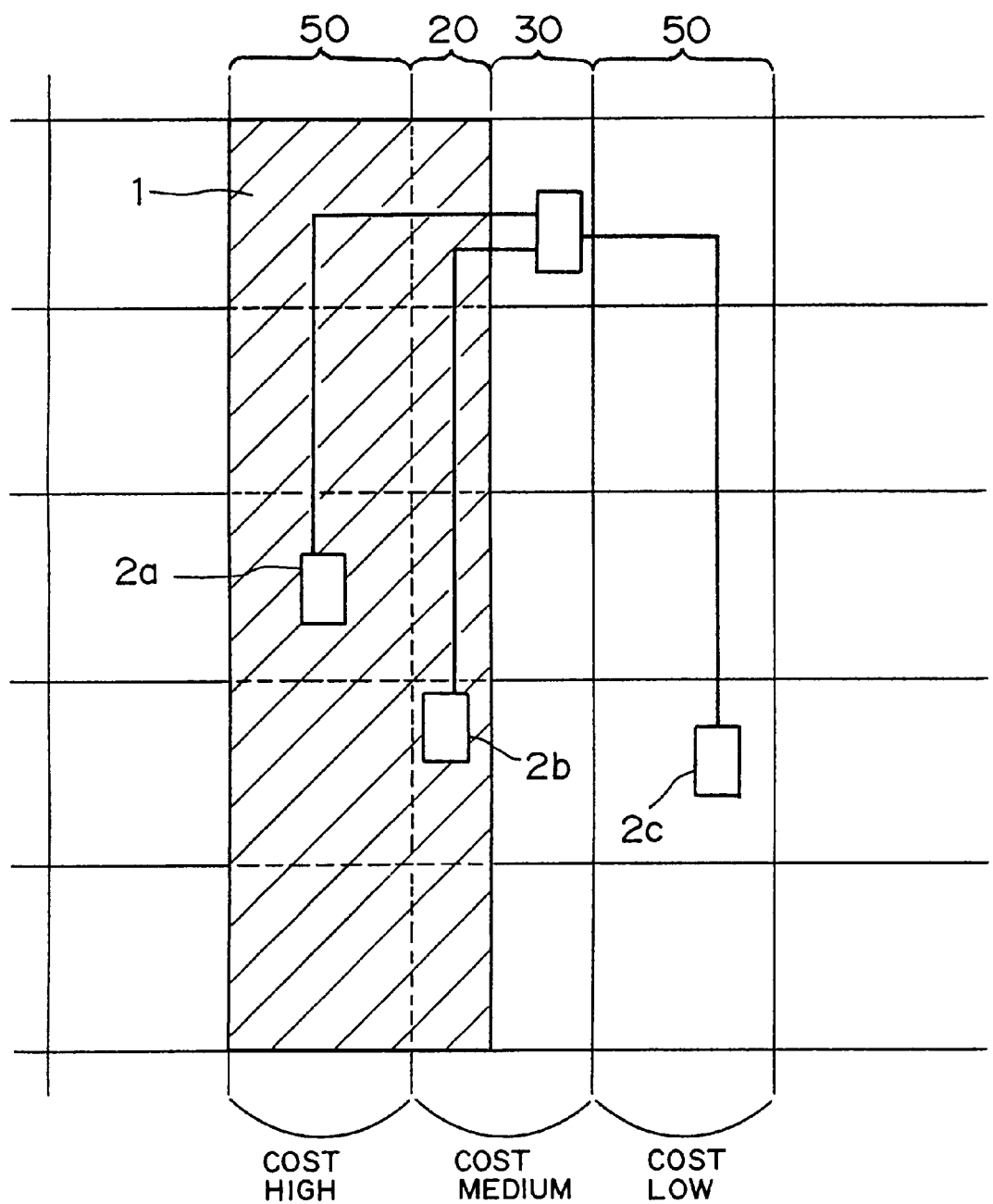
FIG. 11 is a diagram illustrating a procedure of calculation of a routing congestion employed in the cell placement apparatus shown in FIG. 2.

An influence upon the placement position of a cell 2 (2a to 2c) of the fact that the number of routing grids overlaid by the bulk power supply wire 1 is taken into consideration upon cost calculation can be seen from FIG. 11.

It is assumed that a chip is divided into, for example, regions (meshes) of 50 grids, and the cost for any division which is entirely covered by the bulk power supply wire 1 is high; the cost for any division whose approximately half portion corresponding to 20 grids are covered by the bulk power supply wire 1 is medium; and the cost for any division which is not passed by the bulk power supply wire 1 is low, and it is considered to place cells 2a, 2b and 2c.

If it is assumed that the cell 2a is placed in an area whose cost is high, the cell 2b is placed in another area whose cost is medium and the cell 2c is placed in a further area whose cost is low, then the possibility that the cell 2c may be placed is highest and the possibility that the cell 2b may be placed is second highest, but the possibility that the cell 2a may be placed is lowest. From this, it can be seen that a cell placement result with the routing performance sufficiently taken into consideration is obtained while very many cells 2 are not placed in the area in which the bulk power supply wire 1 is routed.

In other words, since the cost at a location at which the bulk power supply wire 1 passes is set high, the possibility that cells 2 (2a to 2c) may be placed at locations at which the bulk power supply wire 1 is not present increases, and partial placement of the cells 2 can be suppressed.

Figure 12:
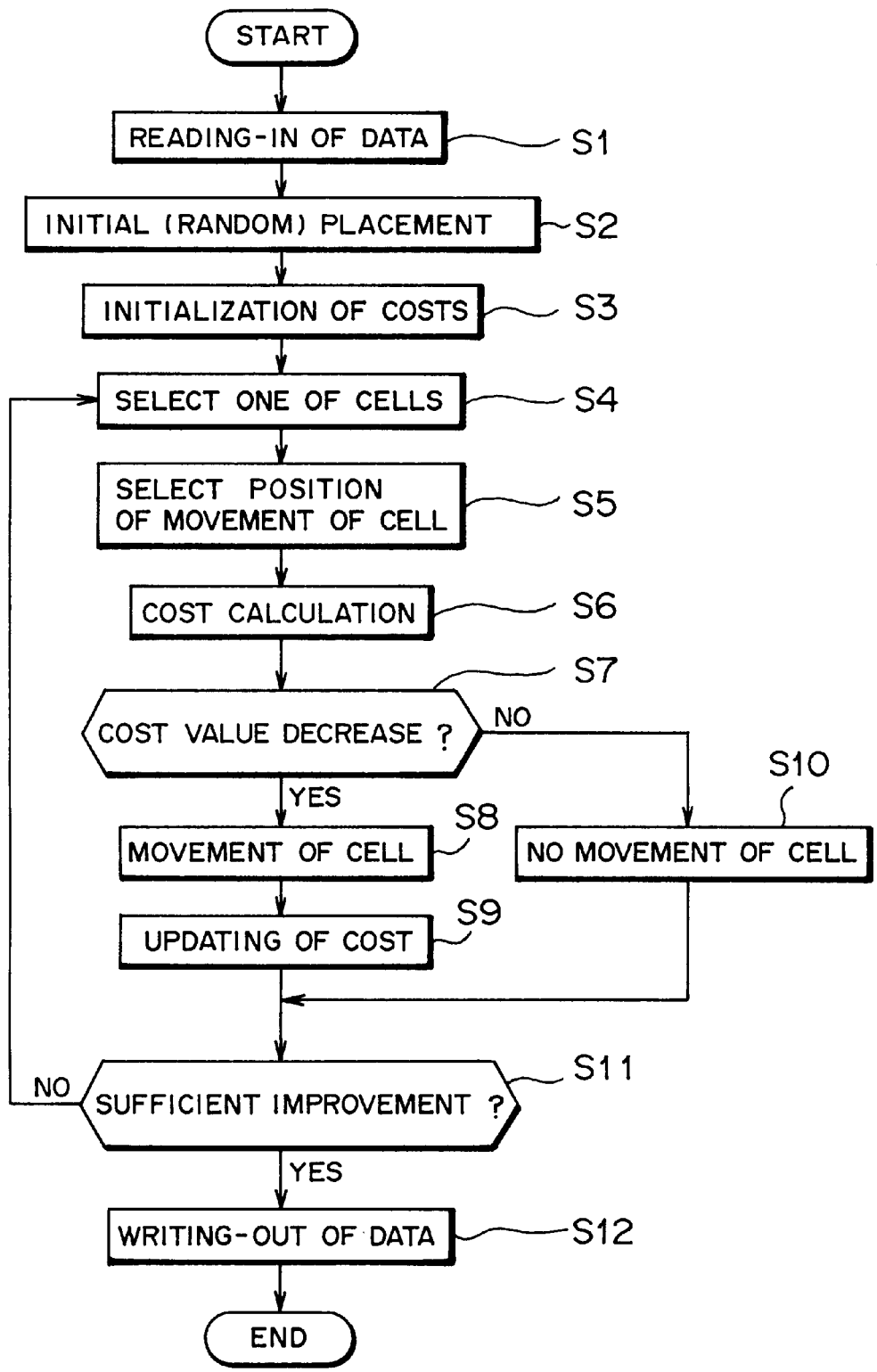
FIG. 12 is a flow chart illustrating operation of the cell placement apparatus shown in FIG. 2.

After the cost at the position is calculated, if it is discriminated by the cell movement permission/rejection discrimination section 36 of the cell movement processing section 35 that the cost calculated by the cost calculation section 33 decreases as a result of the movement of the cell 2 (when the discrimination in step S7 of FIG. 12 is YES; or a requirement for movement of the cell 2 is satisfied in a simulated annealing method or the like), the movement of the cell 2 to the destination of movement is permitted, and the cell 2 is moved to the destination of movement by the cell movement processing section 35 (step S8 of FIG. 12). Thereafter, updating to the new cost, that is, writing of the new cost into the cost information memory section 29, is performed (step S9 of FIG. 12).

On the other hand, if it is discriminated by the cell movement permission/rejection discrimination section 36 that the cost is not decreased by the movement of the cell 2 (when the discrimination in step S7 of FIG. 12 is NO; or a requirement for movement of the cell 2 is not satisfied in a simulated annealing method or the like), movement of the cell 2 to the destination of movement is not performed (step S10 of FIG. 12).

Then, the cell placement processing section 30 discriminates whether or not the cell placement has been improved sufficiently (step S11 of FIG. 12). If the improvement is not sufficient (the discrimination in step S11 is NO), the control sequence returns to step S4 to repeat similar processing to that described above. On the other hand, if the improvement is sufficient (the discrimination in step S11 is YES), the placement data of the cell 2 as a result are written out (step S12 of FIG. 12), thereby ending the processing.

Since the bulk power supply wire 1 is regarded as an ordinary wire and reflected on the cost of a routing congestion, optimization of the placement state of the cells 2 (improvement in placement by movements of the cells) can be performed while recognizing wires nearer to actual wires. In particular, the routing congestion costs around an area in which the bulk power supply wire 1 passes are higher than the other locations, and the cells 2 are not excessively concentrated around the bulk power supply wire 1 and a suitable routing area can be assured.

In this manner, with the cell placement apparatus 20 as an embodiment of the present invention, since placement processing of the cells 2 can be performed while the position of the bulk power supply wire 1 and the routing layers of the wiring patterns 3 in the cells 2 are recognized and care is taken so that the wiring patterns 3 in any cell 2 may not short-circuit with the bulk power supply wire 1, an area which cannot conventionally be utilized due to the presence of the bulk power supply wire 1 can be utilized efficiently, and besides a placement result of a high routing performance can be obtained without increasing the processing time. In particular, since a cell placement area can be assured and a lot of cells 2 can be disposed efficiently on one chip, the cell placement apparatus 20 contributes very much to realization of an increase in density and function of an integrated circuit such as an LSI.

It is to be noted that, while, in the embodiment described above, the already routed wire is the bulk power supply wire 1, the present invention is not limited to the specific placement and can be applied not only to such cell placement in which the bulk power supply wire 1 is taken into consideration but also to a cell placement in which a preferential route such as a clock tree (clock signal wire) is taken into consideration. Also in this instance, similar advantages to those of the embodiment described above can be achieved.

Further, while, in the embodiment described above, the cells 2 are placed while care is taken so that the wiring patterns 3 in the cells 2 and the bulk power supply wire 1 may not short-circuit with each other, it is also possible to realize a cell placement of a higher efficiency by placing plural cells 2 in a partially overlapping relationship with each other while care is taken so that the wiring patterns 3 in the cells 2 may not short-circuit with each other in a similar manner as in the embodiment described above.

Further, while, in the embodiment described above, the total number of routing layers is 3, the present invention is not limited to the specific placement and the total number of routing layers may otherwise be 2 or 4 or more. Also the routing layer of an already routed wire is not limited to the uppermost layer and may be routed in a plurality of layers in the routing layer number.

The present invention is not limited to the specifically described embodiment, and variations and modifications may be made without departing from the scope of the present invention.

What is claimed is:

1. A method for placing a plurality of cells, each containing a particular pattern of first wiring, in a plurality of routing layers of a substrate, in which second wiring is previously routed, in designing an integrated circuit, said method comprising:

(a) selecting at least one cell among the plural cells and a local substrate area corresponding to the selected one cell for the prospective placement of the selected one cell;

(b) judging whether the second wiring of the plural routing layers overlaps the first wiring of the selected one cell in at least one of the plural routing layers inside the selected local substrate area; and (c) placing the selected one cell in the selected local substrate area if the second wiring of the plural routing layers does not overlap the first wiring of the selected one cell in any one of the plural routing layers at the selected local substrate area.

2. A method as claimed in claim 1, wherein each of the plural routing layers is divided into a plurality of site units each corresponding to a basic cell, and said judging in said (b) is carried out for each said site unit.

3. A method as claimed in claim 2, wherein said judging in said (b) includes:

if the lowest routing layer that is crossed by the second wiring of the plural routing layers is not lowest among the plural routing layers, (b1) determining, for each said site unit, the highest layer that is crossed by the first wiring of the selected one cell as a representative routing layer;

(b2) determining the lowest routing layer crossed by the second wiring of the plural routing layers as a reference routing layer;

(b3) comparing, for each said site unit, the representative routing layer with the reference routing layer; and (b4) judging that the second wiring of the plural routing layers does not overlap the first wiring of the selected one cell in any one of the plural routing layers at the selected local substrate area if the representative routing layer is lower than the reference routing layer at every site unit in the selected local substrate area.

4. A method as claimed in claim 2, wherein said judging in said (b) includes:

if the highest routing layer that is crossed by the second wiring of the plural routing layers is not highest among the plural routing layers, (b1) determining, for each said site unit, the lowest layer that is crossed by the first wiring of the selected one cell as a representative routing layer;

(b2) determining the highest layer crossed by the second wiring of the plural routing layers as a reference routing layer;

(b3) comparing, for each said site unit, the representative routing layer with the reference routing layer; and (b4) judging that the second wiring of the plural routing layers does not overlap the first wiring of the selected one cell in any one of the plural routing layers at the selected local substrate area if the representative routing layer is higher than the reference routing layer at every site unit in the selected local substrate area.

5. A method as claimed in claim 2, wherein said judging in said (b) includes:

if the number of the plural routing layers is n and the second wiring is routed only in the n-th layer which is highest among the plural routing layers, where n is a natural number, (b1) determining, for each said site unit, the highest layer that is crossed by the first wiring of the selected one cell as the x-th layer from the bottom;

(b2) allocating to each sated site unit n if the second wiring crosses the last-named site unit and n+1 if the second wiring does not cross the same site unit;

(b3) comparing x with y for each said site unit, where y represents n or n+1 allocated in said step (b2); and (b4) judging that the second wiring of the plural routing layers does not overlap the first wiring of the selected one cell in any one of the plural routing layers at the selected local substrate area if x is smaller than y at every site unit in the selected local substrate.

6. A method as claimed in claim 2, wherein said judging in said (b) includes:

if the number of the plural, routing layers is n and the second wiring is routed only in the n-th layer which is lowest among the plural routing layers, where n is a natural number, (b1) determining, for each said site unit, the lowest layer that is crossed by the first wiring of the selected one cell as the x-th layer from the top;

(b2) allocating to each said site unit n if the second wiring crosses the last-named site unit and n+1 if the second wiring does not cross the same site unit;

(b3) comparing x with y for each said site unit, where y represents n or n+1 allocated in said step (b2); and (b4) judging that the second wiring of the plural routing layers does not overlap the first wiring of the selected one cell in any one of the plural routing layers at the selected local substrate area if x is smaller than y at every site unit in the selected local substrate.

7. A method as claimed in claim 1, further comprising:

(d) selecting another local substrate area in which the selected cell is to be placed;

(e) computing, for each of the first local substrate area selected in said (a) and the second local substrate area selected in said (d), a cost representing a probable congestion of routing based on both the second wiring in the last-named local substrate area and a wiring which connects the selected one cell with another cell among the plural cells;

(f) moving the selected one cell to the second local substrate area according to a predetermined probability function on the basis of both the cost for the second local substrate area and the cost of the first local substrate area; and (g) repeating said (d) through (f) to thereby reduce the congestion of routing.

8. An apparatus for placing a plurality of cells, each containing a particular pattern of first wiring, in a plurality of routing layers of a substrate, in which second wiring is previously routed, in designing an integrated circuit, said apparatus comprising:

(a) a first-wiring storage section for storing the pattern of wiring contained in each of the plural cells;

(b) a second-wiring storage section for storing the pattern of wiring routed in the plural routing layers;

(c) a search section for selecting at least one cell among the plural cell, and for selecting at least one local substrate area corresponding to the selected one cell for the prospective placement of the selected one cell; and (d) a placement section for judging, for the selected local substrate area, whether the second wiring of the plural routing layers overlaps the first wiring of the selected one cell in at least one of the plural routing layers inside the selected local substrate area, and for placing the selected one cell in the selected local substrate area if the second wiring of the plural routing layers does not overlap the first wiring of the selected one cell in any one of the plural routing layers at the selected local substrate area.

9. An apparatus as claimed in claim 8, further comprising (e) an individual site information section for, when each of the plural routing layers is divided into plurality of site units each corresponding to a basic cell, discriminating routing layers that the first wiring of the selected one cell crosses and routing layers that the second wiring crosses among the plural routing layers for each site unit;

said placement section being operable to carry out the judgement for each said site unit based on the discrimination of said site information section.

10. An apparatus as claimed in claim 9, wherein said placement section includes, for carrying out the judgement if the lowest routing layer that is crossed by the second wiring of the plural routing layers is not lowest among the plural routing layers:

(d1) means for determining, for each said site unit, the highest layer that is crossed by the first wiring of the selected one cell as a representative routing layer;

(d2) means for determining the lowest routing layer crossed by the second wiring of the plural routing layers as a reference routing layer;

(d3) means for comparing, for each said site unit, the representative routing layer with the reference routing layer; and (d4) means for judging that the second wiring of the plural routing layers does not overlap the first wiring of the selected one cell in any one of the plural routing layers at the selected local substrate area if the representative routing layer is lower than the reference routing layer at every site unit in the selected local substrate area.

11. An apparatus as claimed in claim 9, wherein said placement section includes, for carrying out the judgement if the highest routing layer that is crossed by the second wiring of the plural routing layers is not highest among the plural routing layers:

(d1) means for determining, for each said site unit, the lowest layer that is crossed by the first wiring of the selected one cell as a representative routing layer;

(d2) means for determining the highest layer crossed by the second wiring of the plural routing layers as a reference routing layer;

(d3) means for comparing, for each said site unit, the representative routing layer with the reference routing layer; and (d4) means for judging that the second wiring of the plural routing layers does not overlap the first wiring of the selected one cell in any one of the plural routing layers at the selected local substrate area if the representative routing layer is higher than the reference routing layer at every site unit in the selected local substrate area.

12. An apparatus as claimed in claim 9, wherein said placement section includes, for carrying out the judgement if the number of the plural routing layers is n and the second wiring is routed only in the n-th layer which is highest among the plural routing layers, where n is a natural number:

(d1) means for determining, for each said site unit, the highest layer that is crossed by the first, wiring of the selected one cell as the x-th layer from the bottom;

(d2) means for allocating to each said site unit n if the second wiring crosses the last-named site unit and n+1 if the second wiring does not crosses the same site unit;

(d3) means for comparing x with y for each said site unit, where y represents n or n+1 allocated to the last-named site unit; and (d4) means for judging that the second wiring of the plural routing layers does not overlap the first wiring of the selected one cell in any one of the plural routing layers at the selected local substrate area if x is smaller than y at every site unit in the selected local substrate.

13. An apparatus as claimed in claim 9, wherein said placement section includes, for carrying out the judgement if the number of the plural routing layers is n and the second wiring is routed only in the n-th layer which is lowest among the plural routing layers, where n is a natural number:

(d1) means for determining, for each said site unit, the lowest layer that is crossed by the first wiring of the selected one cell as the x-th layer from the top;

(d2) means for allocating to each said site unit n if the second wiring crosses the last-named site unit and n+1 if the second wiring does not cross the same site unit;

(d3) means for comparing x with y for each said site unit, where y represents n or n+1 allocated to the last-named site unit; and (d4) means for judging that the second wiring of the plural routing layers does not overlap the first wiring of the selected one cell in any one of the plural routing layers at the selected local substrate area if x is smaller than y at every site unit in the selected local substrate.

14. An apparatus as claimed in claim 8, further comprising:

(f) a cost calculation section for calculating, for each of the first local substrate area in which the selected one cell is placed by said placement section and a second local substrate area which is also selected by said search section, a cost representing a probable congestion of routing based on both the second wiring in the last-named local substrate area and a wiring which connects the selected one cell with another cell among the plural cells; and (g) a cell movement section for moving the selected one cell from the first local substrate area according to a predetermined probability function on the basis of both the cost for the first local substrate area and the cost for the second local substrate area.

15. A storage medium storing a computer program for placing a plurality of cells, each containing a particular pattern of first wiring, in a plurality of routing layers of a substrate, in which second wiring is previously routed, in designing an integrated circuit, said program causing a computer to perform:

(a) storing the pattern of wiring contained in each of the plural cells;

(b) storing the pattern of wiring routed in the plural routing layers;

(c) selecting at least one cell among the plural cells, and for selecting at least one local substrate area corresponding to the selected one cell for the prospective placement of the selected one cell; and (d) judging whether the second wiring of the plural routing layers overlaps the first wiring of the selected one cell in at least one of the plural routing layers inside the selected local substrate area, and for placing the selected one cell in the selected local substrate area if the second wiring of the plural routing layers does not overlap the first wiring of the selected one cell in any one of the plural routing layers at the selected local substrate area.

16. A storage medium as claimed in claim 15, wherein said computer program further causes the computer to perform:
   (e) discriminating, when each of the plural routing layers is divided into a plurality of site units each corresponding to a basic cell, routing layers that the first wiring of the selected one cell crosses and routing layers that the second wiring crosses among the plural routing layers for each site unit;
   said judging and placing operable to carry out the judgement for each said site unit based on the discrimination of said discriminating.

17. A storage medium as claimed in claim 16, wherein said placing and judging includes, for carrying out the judgement if the lowest routing layer that is crossed by the second wiring of the plural routing layers is not lowest among the plural routing layers:
   (d1) determining, for each said site unit, the highest layer that is crossed by the first wiring of the selected one cell as a representative routing layer;
   (d2) determining the lowest routing layer crossed a by the second wiring of the plural routing layers as a reference routing layer;
   (d3) comparing, for each said site unit, the representative routing layer with the reference routing layer; and
   (d4) judging that the second wiring of the plural routing layers does not overlap the first wiring of the selected one cell in any one of the plural routing layers at the selected local substrate area if the representative routing layer is lower than the reference routing layer at every site unit in the selected local substrate area.

18. A storage medium as claimed in claim 16, wherein said placing and judging includes, for carrying out the judgement if the highest routing layer that is crossed by the second wiring of the plural routing layers is not highest among the plural routing layers:
   (d1) determining, for each said site unit, the lowest layer that is crossed by the first wiring of the selected one cell as a representative routing layer;
   (d2) determining the highest layer crossed by the second wiring of the plural routing layers as a reference routing layer;
   (d3) comparing, for each said site unit, the representative routing layer with the reference routing layer; and
   (d4) judging that the second wiring of the plural routing layers does not overlap the first wiring of the selected one cell in any one of the plural routing layers at the selected local substrate area if the representative routing layer is higher than the reference routing layer at every site unit in the selected local substrate area.

19. A storage medium as claimed in claim 16, wherein said judging and placing includes, for carrying out the judgement if the number of the plural routing layers is n and the second wiring is routed only in the n-th layer which is highest among the plural routing layer, where n is a natural number:
   (d1) determining, for each said site unit, the highest layer that is crossed by the first wiring of the selected one cell as the x-th layer from the bottom;
   (d2) allocating to each said site unit n if the second wiring crosses the last-named site unit and n+1 if the second wiring does not cross the same site unit;
   (d3) comparing x with y for each said site unit, where y represents n or n+1 allocated to the last-named site unit; and
   (d4) judging that the second wiring of the plural routing layers does not overlap the first wiring of the selected one cell in any one of the plural routing layers at the selected local substrate area if x is smaller than y at every site unit in the selected local substrate.

20. A storage medium as claimed in claim 16, wherein said judging and placing includes, for carrying out the judgement if the number of the plural routing layers is n and the second wiring is routed only in the n-th layer which is lowest among the plural routing layers, where n is a natural number:
   (d1) determining, for each said site unit, the lowest layer that is crossed by the first wiring of the selected one cell as the x-th layer from the top;
   (d2) allocating to each said site unit n if the second wiring crosses the last-named site unit and n+1 if the second wiring does not cross the same site unit;
   (d3) comparing x with y for each said site unit, where y represents n or n+1 allocated to the last-named site unit; and
   (d4) judging that the second wiring of the plural routing layers does not overlap the first wiring of the selected one cell in any one of the plural routing layers at the selected local substrate area if x is smaller than y at every site unit in the selected local substrate.

21. A storage medium as claimed in claim 15, wherein said program further causes the computer to perform:
   (f) calculating, for each of the first local substrate area in which the selected one cell is placed by said judging and placing and a second local substrate area which is also selected by said searching, a cost representing a probable congestion of routing based on both the second wiring in the last-named local substrate area and a wiring which connects the selected one cell with another cell among the plural cells; and
   (g) moving the selected one cell from the first local substrate area the according to a predetermined probability function on the basis of both the cost for the first local substrate area and the cost for the second local substrate area.

22. A method comprising:
   selecting a cell and a substrate area containing a plurality of routing layers, each routing layer divided into a plurality of site units corresponding to a basic cell; and
   judging, for each site unit, whether a second wiring of plural routing layers overlaps a first wiring of the selected cell in the selected substrate area,
   wherein, if there is no overlap in the judging, then placing the selected cell in the selected substrate area.

23. A computer readable storage medium storing a program directing a computer to perform:
   selecting a cell and a substrate area containing a plurality of routing layers, each routing layer divided into a plurality of site units corresponding to a basic cell; and
   judging, for each site unit, whether a second wiring of plural routing layers overlaps a first wiring of the selected cell in the selected substrate area,
   wherein, if there is no overlap in the judging, then placing the selected cell in the selected substrate area.

24. A method for placing a plurality of cells, each containing a particular pattern of first wiring, in a plurality of routing layers of a substrate, in which second wiring is previously routed, in designing an integrated circuit, said method comprising:

selecting at least one cell among the plural cells and a local substrate area in which the selected one cell is to be placed;

judging whether the second wiring of the plural routing layers overlaps the first wiring of the selected one cell in at least one of the plural routing layers at the selected local substrate area; and placing the selected one cell in the selected local substrate area if the second wiring of the plural routing layers does not overlap the first wiring of the selected one cell in any one of the plural routing layers at the selected local substrate area, wherein each of the plural routing layers is divided into a plurality of site units each corresponding to a basic cell, and said judging is carried out for each said site unit.

25. A method as claimed in claim 24, wherein said judging includes:

if the lowest routing layer that is crossed by the second wiring of the plural routing layers is not lowest among the plural routing layers, determining, for each said site unit, the highest layer that is crossed by the first wiring of the selected one cell as a representative routing layer;

determining the lowest routing layer crossed by the second wiring of the plural routing layers as a reference routing layer;

comparing, for each said site unit, the representative routing layer with the reference routing layer; and judging that the second wiring of the plural routing layers does not overlap the first wiring of the selected one cell in any one of the plural routing layers at the selected local substrate area if the representative routing layer is lower than the reference routing layer at every site unit in the selected local substrate area.

26. A method as claimed in claim 24, wherein said judging includes:

if the highest routing layer that is crossed by the second wiring of the plural routing layers is not highest among the plural routing layers, determining, for each said site unit, the lowest layer that is crossed by the first wiring of the selected one cell as a representative routing layer;

determining the highest layer crossed by the second wiring of the plural routing layers as a reference routing layer;

comparing, for each said site unit, the representative routing layer with the reference routing layer; and judging that the second wiring of the plural routing layers does not overlap the first wiring of the selected one cell in any one of the plural routing layers at the selected local substrate area if the representative routing layer is higher than the reference routing layer at every site unit in the selected local substrate area.

27. A method as claimed in claim 24, wherein said judging includes:

if the number of the plural routing layers is n and the second wiring is routed only in the n-th layer which is highest among the plural routing layers, where n is a natural number, determining, for each said site unit, the highest layer that is crossed by the first wiring of the selected one cell as the x-th layer from the bottom;

allocating to each sated site unit n if the second wiring crosses the last-named site unit and n+1 if the second wiring does not cross the same site unit;

comparing x with y for each said site unit, where y represents n or n+1 allocated in said step (b2); and judging that the second wiring of the plural routing layers does not overlap the first wiring of the selected one cell in any one of the plural routing layers at the selected local substrate area if x is smaller than y at every site unit in the selected local substrate.

28. A method as claimed in claim 24, wherein said judging includes:

if the number of the plural, routing layers is n and the second wiring is routed only in the n-th layer which is lowest among the plural routing layers, where n is a natural number, determining, for each said site unit, the lowest layer that is crossed by the first wiring of the selected one cell as the x-th layer from the top;

allocating to each said site unit n if the second wiring crosses the last-named site unit and n+1 if the second wiring does not cross the same site unit;

comparing x with y for each said site unit, where y represents n or n+1 allocated in said step (b2); and judging that the second wiring of the plural routing layers does not overlap the first wiring of the selected one cell in any one of the plural routing layers at the selected local substrate area if x is smaller than y at every site unit in the selected local substrate.

29. An apparatus for placing a plurality of cells, each containing a particular pattern of first wiring, in a plurality of routing layers of a substrate, in which second wiring is previously routed, in designing an integrated circuit, said apparatus comprising:

a first-wiring storage section for storing the pattern of wiring contained in each of the plural cells;

a second-wiring storage section for storing the pattern of wiring routed in the plural routing layers;

a search section for selecting at least one cell among the plural cell, and for selecting at least one local substrate area in which the selected one cell is to be placed;

a placement section for judging whether the second wiring of the plural routing layers overlaps the first wiring of the selected one cell in at least one of the plural routing layers at the selected local substrate area, and for placing the selected one cell in the selected local substrate area if the second wiring of the plural routing layers does not overlap the first wiring of the selected one cell in any one of the plural routing layers at the selected local substrate area; and an individual site information section for, when each of the plural routing layers is divided into plurality of site units each corresponding to a basic cell, discriminating routing layers that the first wiring of the selected one cell crosses and routing layers that the second wiring crosses among the plural routing layers for each site unit;

said placement section being operable to carry out the judgement for each said site unit based on the discrimination of said site information section.

30. An apparatus as claimed in claim 29, wherein said placement section includes, for carrying out the judgement if the lowest routing layer that is crossed by the second wiring of the plural routing layers is not lowest among the plural routing layers:

means for determining, for each said site unit, the highest layer that is crossed by the first wiring of the selected one cell as a representative routing layer;

means for determining the lowest routing layer crossed by the second wiring of the plural routing layers as a reference routing layer;

means for comparing, for each said site unit, the representative routing layer with the reference routing layer; and means for judging that the second wiring of the plural routing layers does not overlap the first wiring of the selected one cell in any one of the plural routing layers at the selected local substrate area if the representative routing layer is lower than the reference routing layer at every site unit in the selected local substrate area.

31. An apparatus as claimed in claim 29, wherein said placement section includes, for carrying out the judgement if the highest routing layer that is crossed by the second wiring of the plural routing layers is not highest among the plural routing layers:

means for determining, for each said site unit, the lowest layer that is crossed by the first wiring of the selected one cell as a representative routing layer;

means for determining the highest layer crossed by the second wiring of the plural routing layers as a reference routing layer;

means for comparing, for each said site unit, the representative routing layer with the reference routing layer; and means for judging that the second wiring of the plural routing layers does not overlap the first wiring of the selected one cell in any one of the plural routing layers at the selected local substrate area if the representative routing layer is higher than the reference routing layer at every site unit in the selected local substrate area.

32. An apparatus as claimed in claim 29, wherein said placement section includes, for carrying out the judgement if the number of the plural routing layers is n and the second wiring is routed only in the n-th layer which is highest among the plural routing layers, where n is a natural number:

means for determining, for each said site unit, the highest layer that is crossed by the first, wiring of the selected one cell as the x-th layer from the bottom;

means for allocating to each said site unit n if the second wiring crosses the last-named site unit and n+1 if the second wiring does not crosses the same site unit;

means for comparing x with y for each said site unit, where y represents n or n+1 allocated to the last-named site unit; and means for judging that the second wiring of the plural routing layers does not overlap the first wiring of the selected one cell in any one of the plural routing layers at the selected local substrate area if x is smaller than y at every site unit in the selected local substrate.

33. An apparatus as claimed in claim 29, wherein said placement section includes, for carrying out the judgement if the number of the plural routing layers is n and the second wiring is routed only in the n-th layer which is lowest among the plural routing layers, where n is a natural number:

means for determining, for each said site unit, the lowest layer that is crossed by the first wiring of the selected one cell as the x-th layer from the top;

means for allocating to each said site unit n if the second wiring crosses the last-named site unit and n+1 if the second wiring does not cross the same site unit;

means for comparing x with y for each said site unit, where y represents n or n+1 allocated to the last-named site unit; and means for judging that the second wiring of the plural routing layers does not overlap the first wiring of the selected one cell in any one of the plural routing layers at the selected local substrate area if x is smaller than y at every site unit in the selected local substrate.

34. A storage medium storing a computer program for placing a plurality of cells, each containing a particular pattern of first wiring, in a plurality of routing layers of a substrate, in which second wiring is previously routed, in designing an integrated circuit, said program causing a computer to perform:

storing the pattern of wiring contained in each of the plural cells;

storing the pattern of wiring routed in the plural routing layers;

selecting at least one cell among the plural cells, and for selecting at least one local substrate area in which the selected one cell is to be placed; and judging whether the second wiring of the plural routing layers overlaps the first wiring of the selected one cell in at least one of the plural routing layers at the selected local substrate area, and for placing the selected one cell in the selected local substrate area if the second wiring of the plural routing layers does not overlap the first wiring of the selected one cell in any one of the plural routing layers at the selected local substrate area; and discriminating, when each of the plural routing layers is divided into a plurality of site units each corresponding to a basic cell, routing layers that the first wiring of the selected one cell crosses and routing layers that the second wiring crosses among the plural routing layers for each site unit;

said judging and placing operable to carry out the judgement for each said site unit based on th discrimination of said discriminating.

35. A storage medium as claimed in claim 34, wherein said placing and judging includes, for carrying out the judgement if the lowest routing layer that is crossed by the second wiring of the plural routing layers is not lowest among the plural routing layers:

determining, for each said site unit, the highest layer that is crossed by the first wiring of the selected one cell as a representative routing layer;

determining the lowest routing layer crossed a by the second wiring of the plural routing layers as a reference routing layer;

comparing, for each said site unit, the representative routing layer with the reference routing layer; and judging that the second wiring of the plural routing layers does not overlap the first wiring of the selected one cell in any one of the plural routing layers at the selected local substrate area if the representative routing layer is lower than the reference routing layer at every site unit in the selected local substrate area.

36. A storage medium as claimed in claim 34, wherein said placing and judging includes, for carrying out the judgement if the highest routing layer that is crossed by the second wiring of the plural routing layers is not highest among the plural routing layers:

determining, for each said site unit, the lowest layer that is crossed by the first wiring of the selected one cell as a representative routing layer;

determining the highest layer crossed by the second wiring of the plural routing layers as a reference routing layer;

comparing, for each said site unit, the representative routing layer with the reference routing layer; and judging that the second wiring of the plural routing layers does not overlap the first wiring of the selected one cell in any one of the plural routing layers at the selected local substrate area if the representative routing layer is higher than the reference routing layer at every site unit in the selected local substrate area.

37. A storage medium as claimed in claim 34, wherein said judging and placing includes, for carrying out the judgement if the number of the plural routing layers is n and the second wiring is routed only in the n-th layer which is highest among the plural routing layer, where n is a natural number:

determining, for each said site unit, the highest layer that is crossed by the first wiring of the selected one cell as the x-th layer from the bottom;

allocating to each said site unit n if the second wiring crosses the last-named site unit and n+1 if the second wiring does not cross the same site unit;

comparing x with y for each said site unit, where y represents n or n+1 allocated to the last-named site unit; and judging that the second wiring of the plural routing layers does not overlap the first wiring of the selected one cell in any one of the plural routing layers at the selected local substrate area if x is smaller than y at every site unit in the selected local substrate.

38. A storage medium as claimed in claim 34, wherein said judging and placing includes, for carrying out the judgement if the number of the plural routing layers is n and the second wiring is routed only in the n-th layer which is lowest among the plural routing layers, where n is a natural number:

determining, for each said site unit, the lowest layer that is crossed by the first wiring of the selected one cell as the x-th layer from the top;

allocating to each said site unit n if the second wiring crosses the last-named site unit and n+1 if the second wiring does not cross the same site unit;

comparing x with y for each said site unit, where y represents n or n+1 allocated to the last-named site unit; and judging that the second wiring of the plural routing layers does not overlap the first wiring of the selected one cell in any one of the plural routing layers at the selected local substrate area if x is smaller than y at every site unit in the selected local substrate.

\* \* \* \* \*